United States Patent
Yagita

(10) Patent No.: US 9,293,295 B2
(45) Date of Patent: Mar. 22, 2016

(54) ION IMPLANTATION APPARATUS, FINAL ENERGY FILTER, AND ION IMPLANTATION METHOD

(71) Applicant: Sumitomo Heavy Industries Ion Technology Co., Ltd., Tokyo (JP)

(72) Inventor: Takanori Yagita, Ehime (JP)

(73) Assignee: Sumitomo Heavy Industries Ion Technology Co., Ltd., Tokyo (JP)

(*) Notice: Subject to any disclaimer, the term of this patent is extended or adjusted under 35 U.S.C. 154(b) by 0 days.

(21) Appl. No.: 14/670,173

(22) Filed: Mar. 26, 2015

(65) Prior Publication Data

US 2015/0279612 A1    Oct. 1, 2015

(30) Foreign Application Priority Data

Mar. 27, 2014  (JP) ................. 2014-067156

(51) Int. Cl.
  *H01J 37/317* (2006.01)
  *H01J 37/147* (2006.01)
  *H01J 37/05* (2006.01)
  *H01J 37/30* (2006.01)

(52) U.S. Cl.
  CPC ............... *H01J 37/147* (2013.01); *H01J 37/05* (2013.01); *H01J 37/3171* (2013.01); *H01J 37/3007* (2013.01); *H01J 2237/057* (2013.01)

(58) Field of Classification Search
  CPC ..... H01J 37/12; H01J 37/3171; H01J 37/147; H01J 37/05; H01J 37/1477; H01J 37/1471; H01J 37/265; H01J 37/28; H01J 49/061
  USPC .......... 250/396 R, 492.21, 396 ML, 492.3, 250/492.2, 310, 492.1, 281, 398, 423 R, 250/492.22, 492.23; 438/506
  See application file for complete search history.

(56) References Cited

U.S. PATENT DOCUMENTS

| | | | | |
|---|---|---|---|---|
| 6,563,114 B1 * | 5/2003 | Nagahama | ........... | G01R 31/307 250/306 |
| 6,674,071 B2 * | 1/2004 | Franzen | ................ | H01J 49/062 250/292 |
| 6,777,696 B1 | 8/2004 | Rathmell et al. | | |
| 7,098,614 B2 | 8/2006 | Yamashita | | |

(Continued)

FOREIGN PATENT DOCUMENTS

| | | |
|---|---|---|
| JP | S62-122044 A | 6/1987 |
| JP | H01-149960 A | 6/1989 |

(Continued)

*Primary Examiner* — David A Vanore
(74) *Attorney, Agent, or Firm* — Michael Best & Friedrich LLP

(57) ABSTRACT

A final energy filter includes a first adjustment electrode portion, an intermediate electrode portion, and a second adjustment electrode portion. The final energy filter further includes a power supply unit. The power supply unit is configured such that it applies the voltages separately to the first adjustment electrode portion, the intermediate electrode portion, and the second adjustment electrode portion. The power supply unit applies voltages to an upstream auxiliary electrode portion, a deflection electrode portion and a downstream auxiliary electrode portion, respectively, such that the energy range of ion beam in a first region between the upstream auxiliary electrode portion and the deflection electrode portion is approximately equal to that in a second region between the deflection electrode portion and the downstream auxiliary electrode portion.

23 Claims, 18 Drawing Sheets

(56) References Cited

U.S. PATENT DOCUMENTS

| | | | | |
|---|---|---|---|---|
| 7,138,641 B2* | 11/2006 | Matsushita | H01J 37/3171 | 250/306 |
| 7,276,711 B2* | 10/2007 | Kawaguchi | H01J 37/3171 | 250/251 |
| 7,361,892 B2* | 4/2008 | Kabasawa | H01J 27/024 | 250/290 |
| 7,423,276 B2* | 9/2008 | Yagita | H01J 37/05 | 250/396 ML |
| 7,435,976 B2 | 10/2008 | Naito et al. | | |
| 7,507,978 B2* | 3/2009 | Vanderberg | H01J 37/04 | 250/294 |
| 7,791,049 B2* | 9/2010 | Tsukihara | H01J 37/045 | 250/281 |
| 7,851,772 B2* | 12/2010 | Tsukihara | H01J 37/045 | 250/281 |
| 7,888,653 B2* | 2/2011 | Kellerman | H01J 37/12 | 250/396 R |
| 7,982,192 B2* | 7/2011 | Tsukihara | H01J 37/1477 | 250/396 R |
| 8,129,695 B2* | 3/2012 | Kellerman | H01J 37/1477 | 250/396 R |
| 8,389,964 B2* | 3/2013 | Igo | H01J 37/147 | 250/396 R |
| 8,519,353 B2* | 8/2013 | Radovanov | H01J 37/12 | 250/396 R |
| 8,673,753 B1* | 3/2014 | Wan | H01J 37/3171 | 438/373 |
| 8,692,216 B2* | 4/2014 | Kariya | H01L 21/67213 | 250/396 ML |
| 8,772,741 B2* | 7/2014 | Ninomiya | H01J 37/3023 | 250/492.21 |
| 8,921,803 B2* | 12/2014 | Welkie | H01J 37/12 | 250/288 |
| 8,952,340 B2* | 2/2015 | Kabasawa | H01J 37/05 | 250/288 |
| 9,000,395 B2* | 4/2015 | Ren | H01J 37/05 | 250/310 |
| 9,153,418 B2* | 10/2015 | Sasajima | H01J 37/265 | |
| 2010/0065761 A1 | 1/2010 | Berry | | |
| 2012/0223244 A1* | 9/2012 | Welkie | H01J 37/12 | 250/396 ML |
| 2013/0256566 A1* | 10/2013 | Kariya | H01L 21/67213 | 250/492.21 |
| 2014/0345522 A1* | 11/2014 | Kabasawa | H01L 21/26506 | 118/688 |
| 2015/0064887 A1* | 3/2015 | Manabe | H01J 37/243 | 438/514 |
| 2015/0064888 A1* | 3/2015 | Yagita | H01J 37/243 | 438/514 |
| 2015/0136996 A1* | 5/2015 | Inada | H01J 37/3171 | 250/396 R |
| 2015/0279612 A1* | 10/2015 | Yagita | H01J 37/147 | 250/396 R |

FOREIGN PATENT DOCUMENTS

| | | |
|---|---|---|
| JP | 3738734 B2 | 1/2006 |
| JP | 2006-518916 A | 8/2006 |
| JP | 4133883 B2 | 8/2008 |
| JP | 2010-505234 A | 2/2010 |
| JP | 2010-123547 A | 6/2010 |
| JP | 2012-503295 A | 2/2012 |
| JP | 2012-514836 A | 6/2012 |
| JP | 2013-516046 A | 5/2013 |

* cited by examiner

VOLTAGE

ENERGY

VOLTAGE

ENERGY

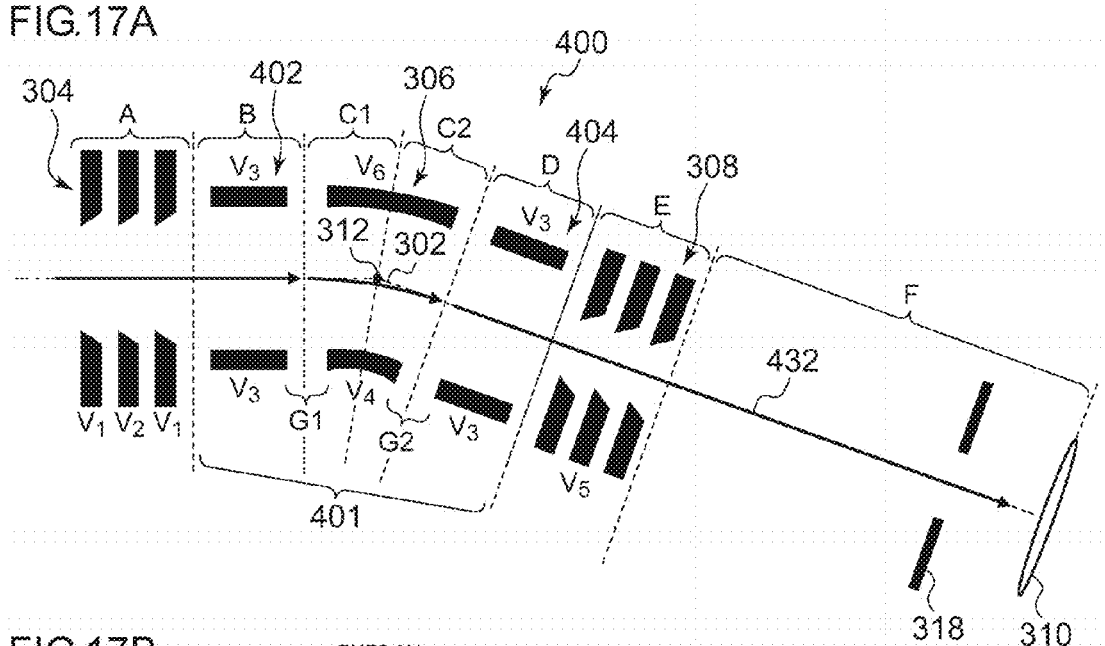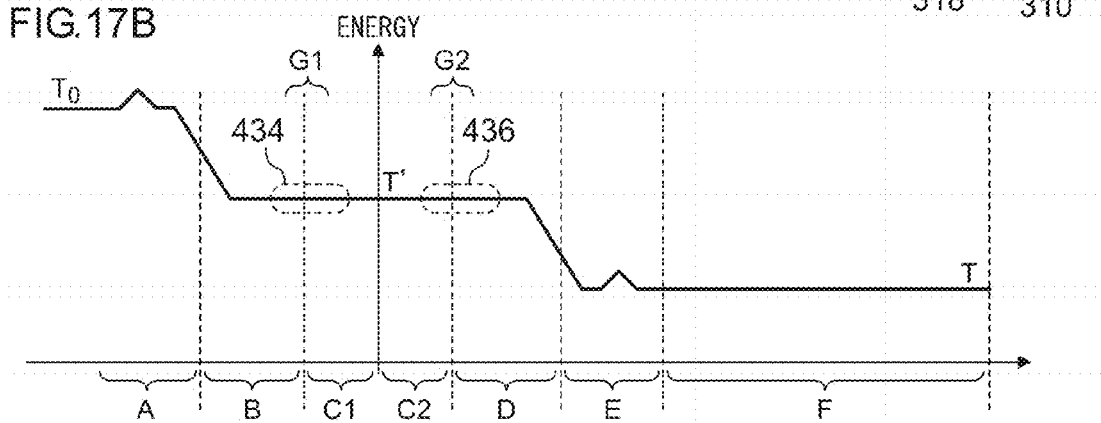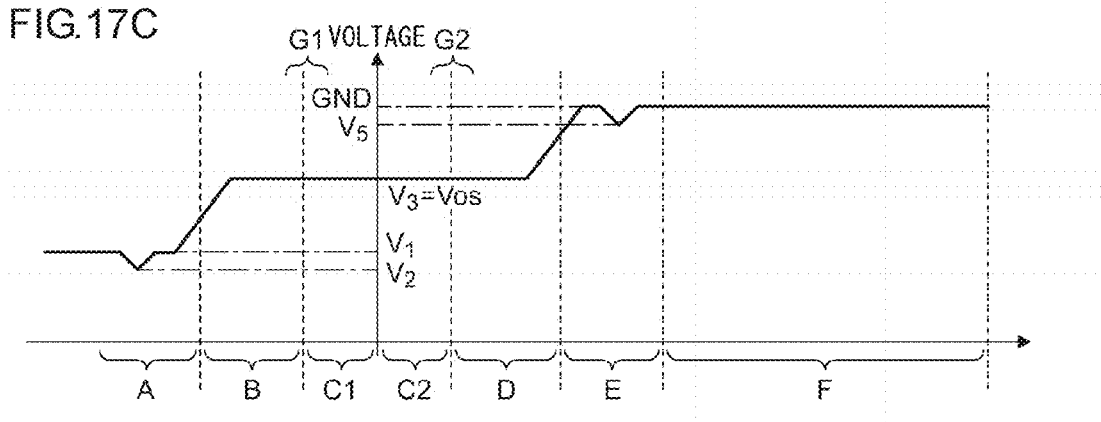

ION IMPLANTATION APPARATUS, FINAL ENERGY FILTER, AND ION IMPLANTATION METHOD

RELATED APPLICATION

Priority is claimed to Japanese Patent Application No. 2014-67156, filed on Mar. 27, 2014, the entire content of which is incorporated herein by reference.

BACKGROUND OF THE INVENTION

1. Field of the Invention

The present invention relates to an ion implantation, and more particularly to an ion implantation apparatus and an ion implantation method.

2. Description of the Related Art

In a certain ion implantation apparatus, an ion source is connected to a power supply thereof such that an ion beam having a small amount of beam current is extracted from the ion source. In this apparatus, the connection between the ion source and the power supply may be modified such that an ion beam having a large amount of beam current is extracted from the ion source.

Another ion implantation apparatus includes an ion source, an acceleration tube, and an electric circuit connecting the power supplies thereof, so as to implant ions into a target at high ion energy. The electric circuit is provided with a selector switch for switching the connections so as to implant ions at low ion energy.

Attempts to extend the operating range of the ion implantation apparatus to some degree have been made as described above. However, a realistic proposal to the extension of the operating range beyond the existing categories is rare.

Generally, ion implantation apparatuses are classified into three categories: a high-current ion implantation apparatus, a medium-current ion implantation apparatus, and a high energy ion implantation apparatus. Since practical design requirements are different for each category, an apparatus of one category and an apparatus of another category may have significantly different configurations in, for example, beamline. Therefore, in the use of the ion implantation apparatus (for example, in a semiconductor manufacturing process), it is considered that apparatuses of different categories have no compatibility. That is, for particular ion implantation processing, an apparatus of a particular category is selected and used. Therefore, for a variety of ion implantation processing, it is necessary to own various types of ion implantation apparatuses.

SUMMARY OF THE INVENTION

An exemplary object of an aspect of the present invention is to provide an ion implantation apparatus and an ion implantation method which can be used in a wide range, for example, an ion implantation apparatus which can serve as both a high-current ion implantation apparatus and a medium-current ion implantation apparatus, and an ion implantation method.

According to an embodiment of the present invention, there is provided an ion implantation apparatus including: an ion implantation processing chamber adapted to irradiate a workpiece with an ion beam having an intended energy; a beamline exit arranged upstream of the ion implantation processing chamber; and a final energy filter arranged between the beamline exit and the workpiece. The final energy filter includes: a first adjustment electrode portion that adjusts a beam shape of the ion beam, the first adjustment electrode portion being arranged downstream of the beamline exit; an intermediate electrode portion that deflects the ion beam, the intermediate electrode portion being arranged downstream of the first adjustment electrode portion; a second adjustment electrode portion that adjusts the beam shape of the ion beam, the second adjustment electrode portion being arranged downstream of the intermediate electrode portion; and a power supply unit that applies voltages separately to the first adjustment electrode portion, the intermediate electrode portion and the second adjustment electrode portion, respectively, in a manner such that one of deceleration, acceleration and iso-energetic transportation of the ion beam is carried out between the first adjustment electrode portion and the intermediate electrode portion, and such that one of deceleration, acceleration and iso-energetic transportation of the ion beam is carried out between the intermediate electrode portion and the second adjustment electrode portion. The intermediate electrode portion includes: a deflection electrode portion; an upstream auxiliary electrode portion arranged between the first adjustment electrode portion and the deflection electrode portion; and a downstream auxiliary electrode portion arranged between the deflection electrode portion and the second adjustment electrode portion. The power supply unit applies voltages to the upstream auxiliary electrode portion, the deflection electrode portion and the downstream auxiliary electrode portion, respectively, such that an energy range of the ion beam in a first region between the upstream auxiliary electrode portion and the deflection electrode portion is approximately equal to a second energy range of the ion beam in a second region between the deflection electrode portion and the downstream auxiliary electrode portion.

According to another embodiment of the present invention, there is provided a final energy filter arranged between an ion implantation processing chamber adapted to irradiate a workpiece with an ion beam having an intended energy, and a beamline exit arranged upstream of the ion implantation processing chamber. The final energy filter includes: a first adjustment electrode portion that adjusts a beam shape of the ion beam, the first adjustment electrode portion being arranged downstream of the beamline exit; an intermediate electrode portion that deflects the ion beam, the intermediate electrode portion being arranged downstream of the first adjustment electrode portion; a second adjustment electrode portion that adjusts the beam shape of the ion beam, the second adjustment electrode portion being arranged downstream of the intermediate electrode portion; and a power supply unit that applies voltages separately to the first adjustment electrode portion, the intermediate electrode portion and the second adjustment electrode portion, respectively, in a manner such that one of deceleration, acceleration and iso-energetic transportation of the ion beam is carried out between the first adjustment electrode portion and the intermediate electrode portion, and such that one of deceleration, acceleration and iso-energetic transportation of the ion beam is carried out between the intermediate electrode portion and the second adjustment electrode portion. The intermediate electrode portion includes: a deflection electrode portion; an upstream auxiliary electrode portion arranged between the first adjustment electrode portion and the deflection electrode portion; and a downstream auxiliary electrode portion arranged between the deflection electrode portion and the second adjustment electrode portion. The power supply unit applies voltages to the upstream auxiliary electrode portion, the deflection electrode portion and the downstream auxiliary electrode portion, respectively, such that a first energy range of the ion beam in a first region between the upstream auxiliary electrode portion and the deflection electrode portion is approximately equal to a second energy range of the ion beam in a second region between the deflection electrode portion and the downstream auxiliary electrode portion.

According to still another embodiment of the present invention, there is provided a method for implanting ions to a workpiece. The method includes: directing an ion beam, having an intended energy, to the workpiece through a final energy filter; and irradiating the workpiece with the ion beam having the intended energy. The final energy filter is arranged between an implantation processing chamber adapted to irradiating the workpiece with the ion bean and a beamline exit arranged upstream of the ion implantation processing chamber. The final energy filter includes: a first adjustment electrode portion that adjusts a beam shape of the ion beam, the first adjustment electrode portion being arranged downstream of the beamline exit; an intermediate electrode portion that deflects the ion beam, the intermediate electrode portion being arranged downstream of the first adjustment electrode portion; a second adjustment electrode portion that adjusts the beam shape of the ion beam, the second adjustment electrode portion being arranged downstream of the intermediate electrode portion; and a power supply unit that applies voltages separately to the first adjustment electrode portion, the intermediate electrode portion and the second adjustment electrode portion, respectively, in a manner such that one of deceleration, acceleration and iso-energetic transportation of the ion beam is carried out between the first adjustment electrode portion and the intermediate electrode portion, and such that one of deceleration, acceleration and iso-energetic transportation of the ion beam is carried out between the intermediate electrode portion and the second adjustment electrode portion. The intermediate electrode portion includes: a deflection electrode portion; an upstream auxiliary electrode portion arranged between the first adjustment electrode portion and the deflection electrode portion; and a downstream auxiliary electrode portion arranged between the deflection electrode portion and the second adjustment electrode portion. The power supply unit applies voltages to the upstream auxiliary electrode portion, the deflection electrode portion and the downstream auxiliary electrode portion, respectively, such that a first energy range of the ion beam in a first region between the upstream auxiliary electrode portion and the deflection electrode portion is approximately equal to a second energy range of the ion beam in a second region between the deflection electrode portion and the downstream auxiliary electrode portion.

Optional combinations of the aforementioned constituting elements, and implementations of the invention in the form of methods, apparatuses, systems, computer programs and so forth may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 17A schematically illustrates an electrode arrangement of the final energy filter shown in FIG. 16;

FIG. 17B illustrates an exemplary energy profile of ion beam along a beam trajectory when the final energy filter is operated in an offset mode;

FIG. 17C illustrates exemplary voltages applied to the respective components of the final energy filter when the final energy filter is operated in an offset mode;

DETAILED DESCRIPTION OF THE INVENTION

Figure 1:
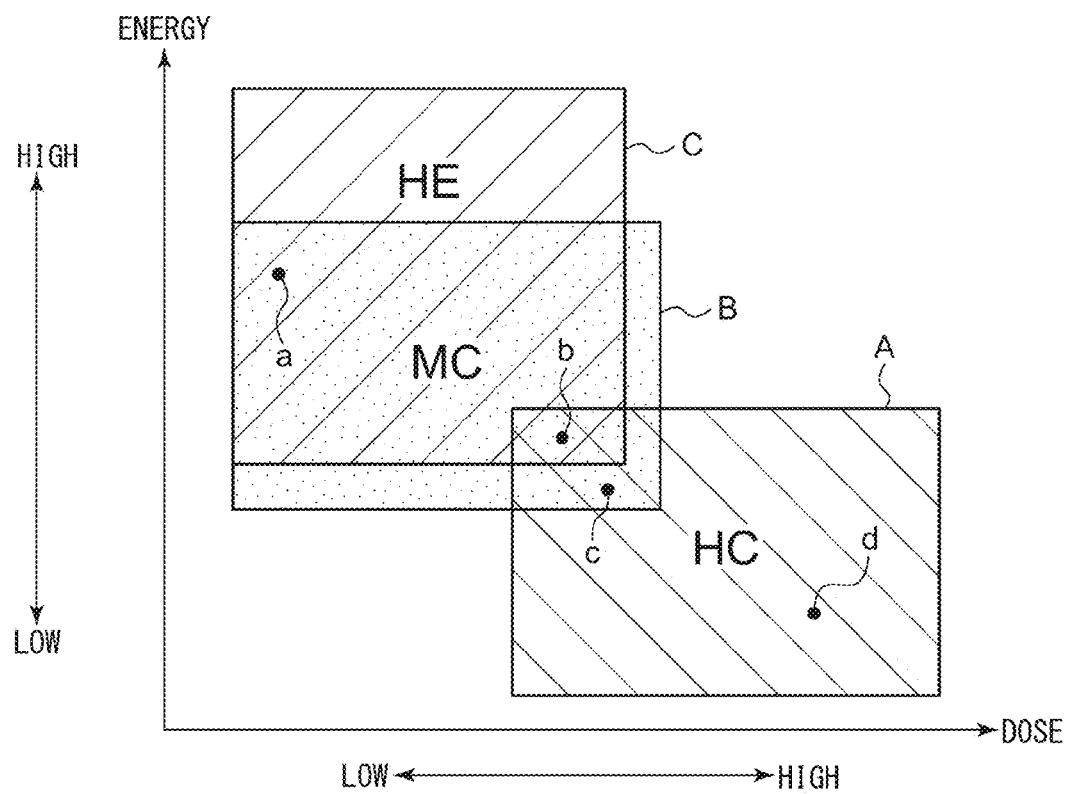
FIG. 1 is a diagram schematically illustrating ranges of an energy and a dose amount in several types of typical ion implantation apparatuses.

The invention will now be described by reference to the preferred embodiments. This does not intend to limit the scope of the present invention, but to exemplify the invention.

Hereinafter, embodiments of the present invention will be described in detail with reference to the drawings. Also, in the description of the drawings, the same reference numerals are assigned to the same components, and a redundant description thereof is appropriately omitted. Also, the configurations described below are exemplary, and do not limit the scope of the present invention. For example, in the following, a semiconductor wafer is described as an example of an object to which an ion implantation is performed, but other materials or members may also be used.

First, a description will be given of circumstances that led to an embodiment of the present invention to be described below. An ion implantation apparatus can select an ion species to be implanted and set an energy and a dose amount thereof, based on desired properties to be established within a workpiece. Generally, ion implantation apparatuses are classified into several categories according to the ranges of energy and dose amount of ions to be implanted. As representative categories, there are a high-dose high-current ion implantation apparatus (hereinafter, referred to as HC), a medium-dose medium-current ion implantation apparatus (hereinafter, referred to as MC), and a high energy ion implantation apparatus (hereinafter, referred to as HE).

FIG. 1 schematically illustrates the energy ranges and the dose ranges of a typical serial-type high-dose high-current ion implantation apparatus HC, a serial-type medium-dose medium-current ion implantation apparatus MC, and a serial-type high energy ion implantation apparatus HE. In FIG. 1, a horizontal axis represents the dose, and a vertical axis represents the energy. The dose is the number of ions (atoms) implanted per unit area (for example, $cm^2$), and the total amount of implanted material is provided by a time integral of ion current. The ion current provided by the ion implantation is generally expressed as mA or μA. The dose is also referred to as an implantation amount or a dose amount. In FIG. 1, the energy and dose ranges of the HC, the MC, and the HE are indicated by symbols A, B, and C, respectively. These are a set range of implantation conditions required according to implantation conditions (also called a recipe) for each implantation, and represent practically reasonable apparatus configuration categories matched with the implantation conditions (recipe), considering practically allowable productivity. Each of the illustrated ranges represents an implantation condition (recipe) range that can be processed by the apparatus of each category. The dose amount represents an approximate value when a realistic processing time is assumed.

The HC is used for ion implantation in a relatively low energy range of about 0.1 to 100 keV and in a high dose range of about $1\times10^{14}$ to $1\times10^{17}$ atoms/$cm^2$. The MC is used for ion implantation in a medium energy range of about 3 to 500 keV and in a medium dose range of about $1\times10^{11}$ to $1\times10^{14}$ atoms/$cm^2$. The HE is used for ion implantation in a relatively high energy range of about 100 keV to 5 MeV and in a relatively low dose range of about $1\times10^{10}$ to $1\times10^{12}$ atoms/$cm^2$. In this way, the broad ranges of the implantation conditions having about five digits for the energy range and about seven digits for the dose ranges are shared by the HC, the MC, and the HE. However, these energy ranges or dose ranges are a representative example, and are not strict. Also, the way of providing the implantation conditions is not limited to the dose and the energy, but is various. The implantation conditions may be set by a beam current value (representing an area integral beam amount of a beam cross-sectional profile by a current), a throughput, implantation uniformity, and the like.

Since the implantation conditions for ion implantation processing include particular values of energy and dose, the implantation conditions can be expressed as individual points in FIG. 1. For example, an implantation condition a has values of a high energy and a low dose. The implantation condition a is in the operating range of the MC and is also in the operating range of the HE. The ion implantation can be processed accordingly using the MC or the HE. An implantation condition b is a medium energy/dose and the ion implantation can be processed by one of the HC, MC, and HE. An implantation condition c is a medium energy/dose and the ion implantation can be processed by the HC or the MC. An implantation condition d is a low energy/a high dose and can be processed by only the HC.

The ion implantation apparatus is an equipment essential to the production of semiconductor devices, and the improvement of performance and productivity thereof has an important meaning to a device maker. The device maker selects an apparatus, which is capable of realizing implantation characteristics necessary for a device to be manufactured, among a plurality of ion implantation apparatus categories. At this time, the device maker determines the number of apparatuses of the category, considering various circumstances such as the realization of the best manufacturing efficiency, the cost of ownership of the apparatus, and the like.

It is assumed that an apparatus of a certain category is used at a high operating rate and an apparatus of another category has a relatively sufficient processing capacity. At this time, if the former apparatus cannot be replaced with the latter apparatus in order to obtain a desired device because implantation characteristics are strictly different for each category, the failure of the former apparatus cause a bottleneck on production processes, and thus overall productivity is impaired. Such trouble may be avoided to some extent by assuming a failure rate and the like in advance and determining a number configuration based on that.

When a manufacturing device is changed due to a change in demand or a technical advance and the number configuration of necessary apparatuses is changed, apparatuses become lacking or a non-operating apparatus occurs and thus an operating efficiency of the apparatuses may be reduced. Such trouble may be avoided to some extent by predicting the trend of future products and reflecting the predicted trend to the number configuration.

Even though the apparatus can be replaced with an apparatus of another category, the failure of the apparatus or the change of the manufacturing device may reduce the production efficiency or lead to wasted investment for the device maker. For example, in some cases, a manufacturing process having been mainly processed till now by a medium-current ion implantation apparatus is processed by a high-current ion implantation apparatus due to the change of the manufacturing device. If doing so, the processing capacity of the high-current ion implantation apparatus becomes lacking, and the processing capacity of the medium-current ion implantation apparatus becomes surplus. If it is expected that the state after the change will not change for a long period of time, the operating efficiency of the apparatus can be improved by taking measures of purchasing a new high-current ion implantation apparatus and selling the medium-current ion implantation apparatus having been owned. However, when a process is frequently changed, or such a change is difficult to predict, a trouble may be caused in production.

In practice, a process having already been performed in an ion implantation apparatus of a certain category in order to manufacture a certain device cannot be immediately used in an ion implantation apparatus of another category. This is because a process of matching device characteristics on the ion implantation apparatus is required. That is, device characteristics obtained by performing a process with the same ion species, energy, and dose amount in the new ion implantation apparatus may be significantly different from device characteristics obtained in the previous ion implantation apparatus. Various conditions other than the ion species, the energy, and the dose amount, for example, a beam current density (that is, a dose rate), an implantation angle, or an overspray method of an implantation region, also affect the device characteristics. Generally, when the categories are different, apparatus configurations also are different. Therefore, even though the ion species, the energy, and the dose amount are specified, it is impossible to automatically match the other conditions affecting the device characteristics. These conditions depend on implantation methods. Examples of the implantation methods include a method of relative movement between a beam and a workpiece (for example, a scanning beam, a ribbon beam, a two-dimensional wafer scanning, or the like), a batch type and a serial type to be described below.

In addition, rough classification of the high-dose high-current ion implantation apparatus and the high energy ion implantation apparatus into a batch type and the medium-dose medium-current ion implantation apparatus into a serial type also increases a difference between the apparatuses. The batch type is a method of processing a plurality of wafers at one time, and these wafers are disposed on, for example, the circumference. The serial type is a method of processing wafers one by one and is also called a single wafer type. Also, in some cases, the high-dose high-current ion implantation apparatus and the high energy ion implantation apparatus are configured as the serial type.

Also, a beamline of the batch-type high-dose high-current ion implantation apparatus is typically made shorter than that of the serial-type medium-dose medium-current ion implantation apparatus by a request on beamline design according to high-dose high-current beam characteristics. This is done for suppressing beam loss caused by divergence of ion beams in a low energy/high beam current condition in the design of the high-dose high-current beamline. In particular, this is done for reducing a tendency to expand outward in a radial direction, so-called a beam blow-up, because ions forming the beam include charged particles repelling each other. The necessity for such design is more remarkable when the high-dose high-current ion implantation apparatus is the batch type than when that is the serial type.

The beamline of the serial-type medium-dose medium-current ion implantation apparatus is made relatively long for ion beam acceleration or beam forming. In the serial-type medium-dose medium-current ion implantation apparatus, ions having considerable momentum are moving at high speed. The momentum of the ions increases while the ions pass through one or several of acceleration gaps added to the beamline. Also, in order to modify a trajectory of particles having considerable momentum, a focusing portion needs to be relatively long enough to fully apply a focusing power.

Since the high energy ion implantation apparatus adopts a linear acceleration method or a tandem acceleration method, it is essentially different from an acceleration method of the high-dose high-current ion implantation apparatus or the medium-dose medium-current ion implantation apparatus. This essential difference is equally applied when the high energy ion implantation apparatus is the serial type or the batch type.

As such, the ion implantation apparatuses HC, MC and HE are recognized as completely different apparatuses because the beamline types or the implantation methods are different according to categories. A difference in configuration between apparatuses of different categories is recognized as inevitable. Among the different types of apparatuses such as HC, MC and HE, process compatibility considering the influence on the device characteristics is not guaranteed.

Therefore, it is preferable that the ion implantation apparatus has a broader energy range and/or dose range than the apparatus of the existing category. In particular, it is desirable to provide an ion implantation apparatus capable of implantation in a broad range of energy and dose amount including at least two existing categories, without changing the type of the implantation apparatus.

Also, in recent years, the mainstream is that all implantation apparatuses adopt the serial type. It is therefore desirable to provide an ion implantation apparatus that has a serial-type configuration and also has a broad energy range and/or dose range.

Also, the HE uses an essentially different acceleration method, and the HC and the MC are common in that ion beams are accelerated or decelerated by a DC voltage. Therefore, there is a probability that the HC and the MC can share the beamline. It is therefore desirable to provide an ion implantation apparatus that can serve as both the HC and the MC.

The apparatus capable of operating at a broad range helps to improve productivity or operating efficiency in view of device makers.

Also, the medium-current ion implantation apparatus MC can operate in a high energy range and a low dose range as compared with the high-current ion implantation apparatus HC. Therefore, in this application, the medium-current ion implantation apparatus MC is also referred to as a low-current ion implantation apparatus. Likewise, regarding the medium-current ion implantation apparatus MC, the energy and the dose are also referred to as high energy and low dose, respectively. Alternatively, regarding the high-current ion implantation apparatus HC, the energy and the dose are also referred to as low energy and high dose, respectively. However, these expressions in this application are not intended to restrictively indicate only the energy range and the dose range of the medium-current ion implantation apparatus MC, but may mean "a high (or low) energy (or dose) range" literally according to the context.

Figure 2:
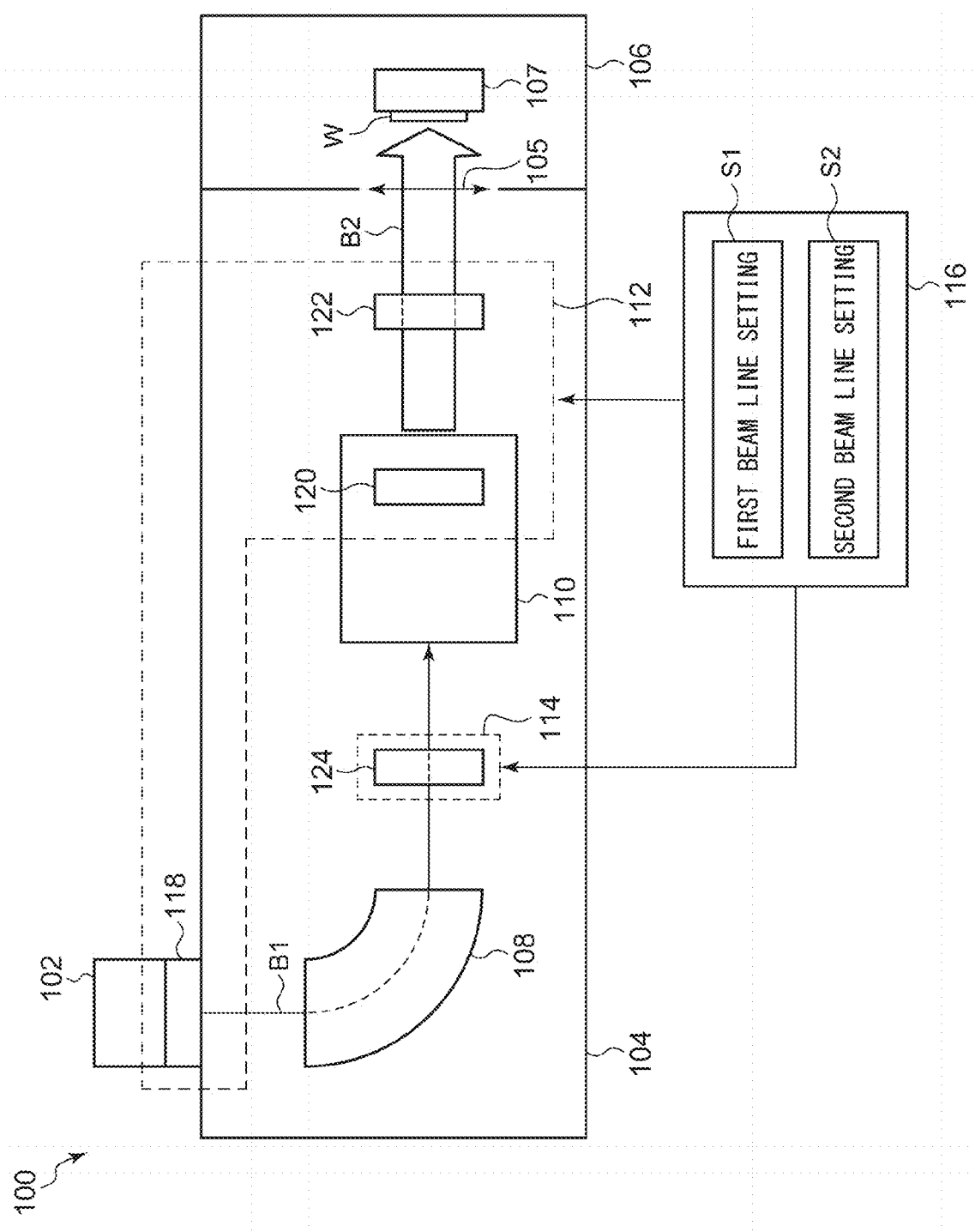
FIG. 2 is a diagram schematically illustrating an ion implantation apparatus according to an embodiment of the present invention.

FIG. 2 is a diagram schematically illustrating an ion implantation apparatus 100 according to an embodiment of the present invention. The ion implantation apparatus 100 is configured to perform ion implantation processing on a surface of a workpiece W according to given ion implantation conditions. The ion implantation conditions include, for example, an ion species to be implanted into the workpiece W, an ion dose amount, and ion energy. The workpiece W is, for example, a substrate, or, for example, a wafer. Therefore, in the following, the workpiece W is also referred to as a substrate W for convenience of description. This is not intended to limit a target of the implantation processing to a particular object.

The ion implantation apparatus 100 includes an ion source 102, a beamline device 104, and an implantation processing chamber 106. Also, the ion implantation apparatus 100 includes a vacuum exhaust system (not illustrated) for providing desired vacuum environments to the ion source 102, the beamline device 104, and the implantation processing chamber 106.

The ion source 102 is configured to generate ions to be implanted into the substrate W. The ion source 102 provides the beamline device 104 with an ion beam B1 accelerated and extracted from the ion source 102 by an extraction electrode unit 118 that is an example of a component for adjusting a beam current. Hereinafter, this may be also referred to as an initial ion beam B1.

The beamline device 104 is configured to transport ions from the ion source 102 to the implantation processing chamber 106. The beamline device 104 provides a beamline for transporting the ion beam. The beamline is a passage of the ion beam and may be also said as a path of beam trajectory. The beamline device 104 performs operations including deflection, acceleration, deceleration, shaping, and scanning, with respect to the initial ion beam B1, thereby forming an ion beam B2. Hereinafter, this may be also referred to as an implantation ion beam B2. The beamline device 104 includes a plurality of beamline components arranged for such beam operations. In this manner, the beamline device 104 provides the implantation processing chamber 106 with the implantation ion beam B2.

The implantation ion beam B2 has a beam irradiation region 105 in the plane perpendicular to a beam transportation direction (or a direction along a beam trajectory) of the beamline device 104. Generally, the beam irradiation region 105 has a width including the width of the substrate W. For example, when the beamline device 104 includes a beam scanning device scanning a spot-shaped ion beam, the beam irradiation region 105 is an elongated irradiation region extending over a scanning range along a longitudinal direction perpendicular to the beam transportation direction. Also, likewise, when the beamline device 104 includes a ribbon beam generator, the beam irradiation region 105 is an elongated irradiation region extending in a longitudinal direction perpendicular to the beam transportation direction. However, the elongated irradiation region is a cross-section of a corresponding ribbon beam. The elongated irradiation region is longer than the width (diameter when the substrate W is circular) of the substrate W in a longitudinal direction.

The implantation processing chamber 106 includes a workpiece holder 107 holding the substrate W such that the substrate W receives the implantation ion beam B2. The workpiece holder 107 is configured to move the substrate W in a direction perpendicular to the beam transportation direction of the beamline device 104 and the longitudinal direction of the beam irradiation region 105. That is, the workpiece holder 107 provides a mechanical scan of the substrate W. In this application, the mechanical scan is the same as reciprocating motion. Also, the "perpendicular direction" is not limited to only a strict right angle. For example, when the implantation is performed in a state in which the substrate W is inclined in a vertical direction, the "perpendicular direction" may include such an inclined angle.

The implantation processing chamber 106 is configured as a serial-type implantation processing chamber. Therefore, the workpiece holder 107 typically holds one sheet of the substrate W. However, like the batch type, the workpiece holder 107 may include a support holding a plurality of (for example, small) substrates, and may be configured to mechanically scan the plurality of substrates by linearly reciprocating the support. In another embodiment, the implantation processing chamber 106 may be configured as a batch-type implantation processing chamber. In this case, for example, the workpiece holder 107 may include a rotating disk that rotatably holds a plurality of substrates W on the circumference of the disk. The rotating disk may be configured to provide a mechanical scanning.

Figure 3:
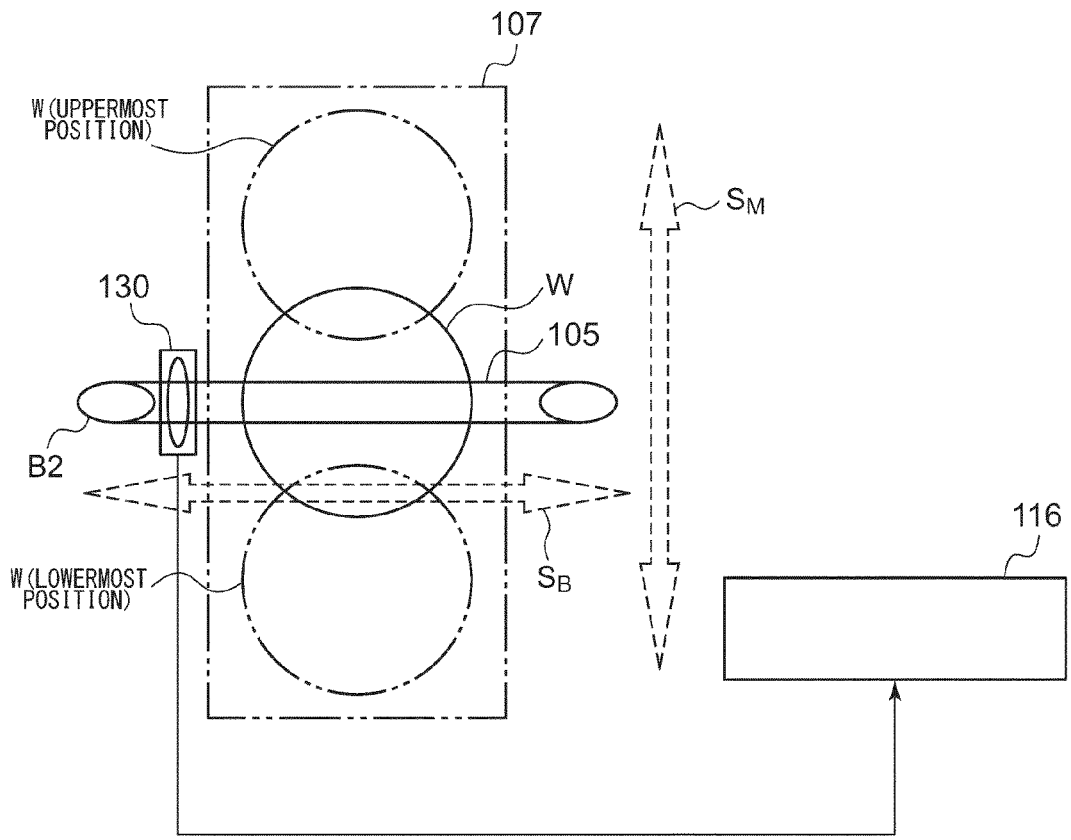
FIG. 3 is a diagram schematically illustrating an ion implantation apparatus according to an embodiment of the present invention.

FIG. 3 illustrates an example of the beam irradiation region 105 and the relevant mechanical scanning. The ion implantation apparatus 100 is configured to perform ion implantation by a hybrid scanning method using both one-dimensional beam scanning $S_B$ of the spot-shaped ion beam B2 and one-dimensional mechanical scanning $S_M$ of the substrate W. On the side of the workpiece holder 107, a beam measurement device 130 (for example, Faraday cup) is provided to overlap the beam irradiation region 105, and the measurement result may be provided to a control unit 116.

In this manner, the beamline device 104 is configured to supply the implantation processing chamber 106 with the implantation ion beam B2 having the beam irradiation region 105. The beam irradiation region 105 is formed to irradiate the implantation ion beam B2 across the substrate W in cooperation with the mechanical scanning of the substrate W. Therefore, ions can be implanted into the substrate W by the relative movement of the substrate W and the ion beam.

In another embodiment, the ion implantation apparatus 100 is configured to perform ion implantation by a ribbon beam+wafer scanning method using both the ribbon-shaped ion beam B2 and the one-dimensional mechanical scanning of the substrate W. The horizontal width of the ribbon beam is expanded while maintaining uniformity, and the substrate W is scanned so as to intersect with the ribbon beam. In a further embodiment, the ion implantation apparatus 100 may be configured to perform ion implantation by a method of two-dimensionally mechanically scanning the substrate W in a state in which the beam trajectory of the spot-shaped ion beam B2 is fixed.

Also, the ion implantation apparatus 100 is not limited to a particular implantation method for implanting ions across a broad region on the substrate W. An implantation method using no mechanical scanning is also possible. For example, the ion implantation apparatus 100 may be configured to perform ion implantation by a two-dimensional beam scanning method of two-dimensionally scanning the substrate W with the spot-shaped ion beam B2. Alternatively, the ion implantation apparatus 100 may be configured to perform ion implantation by a large-size beam method using the two-dimensionally expanded ion beam B2. The large-size beam is expanded to make a beam size equal to or larger than a substrate size while maintaining uniformity, and can process the entire substrate at one time.

Although details will be described below, the ion implantation apparatus 100 may be operated under a first beamline setting S1 for high-dose implantation or a second beamline setting S2 for low-dose implantation. Therefore, the beamline device 104 has the first beamline setting S1 or the second beamline setting S2 during operations. The two settings are determined to generate the ion beams for different ion implantation conditions under the common implantation method. Thus, in the first beamline setting S1 and the second beamline setting S2, the beam center trajectories being the reference of the ion beams B1 and B2 are identical to each other. The beam irradiation regions 105 are also identical to each other in the first beamline setting S1 and the second beamline setting S2.

The beam center trajectory being the reference refers to a beam trajectory when beam is not scanned in the beam scanning method. Also, in the case of the ribbon beam, the beam center trajectory being the reference corresponds to a locus of a geometric center of a beam cross-section.

The beamline device 104 may be divided into a beamline upstream part on the ion source 102 side and a beamline downstream part on the implantation processing chamber 106 side. In the beamline upstream part, for example, a mass spectrometer 108 including a mass analysis magnet and a mass analysis slit is provided. The mass spectrometer 108 performs mass spectrometry on the initial ion beam B1 and provides only necessary ion species to the beamline downstream part. In the beamline downstream part, for example, a beam irradiation region determination unit 110 is provided to determine the beam irradiation region 105 of the implantation ion beam B2.

The beam irradiation region determination unit 110 is configured to emit the ion beam having the beam irradiation region 105 (for example, the implantation ion beam B2) by applying either (or both) of an electric field and a magnetic field to the incident ion beam (for example, the initial ion beam B1). In an embodiment, the beam irradiation region determination unit 110 includes a beam scanning device and a beam parallelizing device. Examples of the beamline components will be described below with reference to FIG. 5.

Also, it should be understood that the division into the upstream part and the downstream part, as above-described, is mentioned for conveniently describing a relative position relationship of the components in the beamline device 104. Therefore, for example, a component in the beamline downstream part may be disposed at a place closer to the ion source 102 away from the implantation processing chamber 106. The opposite holds true as well. Therefore, in an embodiment, the beam irradiation region determination unit 110 may include a ribbon beam generator and a beam parallelizing device, and the ribbon beam generator may include the mass spectrometer 108.

The beamline device 104 includes an energy adjustment system 112 and a beam current adjustment system 114. The energy adjustment system 112 is configured to adjust implantation energy to the substrate W. The beam current adjustment system 114 is configured to adjust the beam current in a broad range so as to change a dose amount implanted into the substrate W in a broad range. The beam current adjustment system 114 is provided to adjust the beam current of the ion beam quantitatively (rather than qualitatively). In an embodiment, the adjustment of the ion source 102 can be also used to adjust the beam current. In this case, the beam current adjustment system 114 may be considered to include the ion source 102. Details of the energy adjustment system 112 and the beam current adjustment system 114 will be described below.

Also, the ion implantation apparatus 100 includes a control unit 116 for controlling all or part of the ion implantation apparatus 100 (for example, all or part of the beamline device 104). The control unit 116 is configured to select any one from a plurality of beamline settings including the first beamline setting S1 and the second beamline setting S2, and operate the beamline device 104 under the selected beamline setting. Specifically, the control unit 116 sets the energy adjustment system 112 and the beam current adjustment system 114 according to the selected beamline setting, and controls the energy adjustment system 112 and the beam current adjustment system 114. Also, the control unit 116 may be a dedicated controller for controlling the energy adjustment system 112 and the beam current adjustment system 114.

The control unit 116 is configured to select a beamline setting suitable for given ion implantation conditions among the plurality of beamline settings including the first beamline setting S1 and the second beamline setting S2. The first beamline setting S1 is suitable for transport of a high-current beam for high-dose implantation into the substrate W. Therefore, for example, the control unit 116 selects the first beamline setting S1 when a desired ion dose amount implanted into the substrate W is in the range of about $1\times10^{14}$ to $1\times10^{17}$ atoms/cm$^2$. Also, the second beamline setting S2 is suitable for transport of a low-current beam for low-dose implantation into the substrate. Therefore, for example, the control unit 116 selects the second beamline setting S2 when a desired ion dose amount implanted into the substrate W is in the range of about $1\times10^{11}$ to $1\times10^{14}$ atoms/cm$^2$. Details of the beamline settings will be described below.

The energy adjustment system 112 includes a plurality of energy adjustment elements arranged along the beamline device 104. The plurality of energy adjustment elements is disposed at fixed positions on the beamline device 104. As illustrated in FIG. 2, the energy adjustment system 112 includes, for example, three adjustment elements, specifically, an upstream adjustment element 118, an intermediate adjustment element 120, and a downstream adjustment element 122. Each of these adjustment elements includes one or more electrodes configured to exert an electric field for accelerating or decelerating the initial ion beam B1 and/or the implantation ion beam B2.

The upstream adjustment element 118 is provided in the upstream part of the beamline device 104, for example, the most upstream part of the beamline device 104. The upstream adjustment element 118 includes, for example, an extraction electrode system for extracting the initial ion beam B1 from the ion source 102 to the beamline device 104. The intermediate adjustment element 120 is installed in the middle portion of the beamline device 104 and includes, for example, an electrostatic beam parallelizing device. The downstream adjustment element 122 is provided in the downstream part of the beamline device 104 and includes, for example, an acceleration/deceleration column. The downstream adjustment element 122 may include an angular energy filter (AEF) disposed in the downstream of the acceleration/deceleration column.

Also, the energy adjustment system 112 includes a power supply system for the above-described energy adjustment elements. This will be described below with reference to FIGS. 6 and 7. Also, the plurality of energy adjustment elements may be provided in any number anywhere on the beamline device 104, which is not limited to the illustrated arrangement. Also, the energy adjustment system 112 may include only one energy adjustment element.

The beam current adjustment system 114 is provided in the upstream part of the beamline device 104, and includes a beam current adjustment element 124 for adjusting the beam current of the initial ion beam B1. The beam current adjustment element 124 is configured to block at least a portion of the initial ion beam B1 when the initial ion beam B1 passes through the beam current adjustment element 124. In an embodiment, the beam current adjustment system 114 may include a plurality of beam current adjustment elements 124 arranged along the beamline device 104. Also, the beam current adjustment system 114 may be provided in the downstream part of the beamline device 104.

The beam current adjustment element 124 includes a movable portion for adjusting a passage region of the ion beam cross-section perpendicular to the beam transportation direction of the beamline device 104. According to the movable portion, the beam current adjustment element 124 constitutes a beam limiting device having a variable-width slit or a variable-shape opening for limiting a portion of the initial ion beam B1. Also, the beam current adjustment system 114 includes a driving device for continuously or discontinuously adjusting the movable portion of the beam current adjustment element 124.

Additionally or alternatively, the beam current adjustment element 124 may include a plurality of adjustment members (for example, adjustment aperture) each having a plurality of beam passage regions having different areas and/or shapes. The beam current adjustment element 124 may be configured to switch the adjustment member disposed on the beam trajectory among the plurality of adjustment members. In this manner, the beam current adjustment element 124 may be configured to adjust the beam current stepwise.

As illustrated, the beam current adjustment element 124 is a beamline component separate from the plurality of energy adjustment elements of the energy adjustment system 112. By separately installing the beam current adjustment element and the energy adjustment element, the beam current adjustment and the energy adjustment may be individually performed. This may increase the degree of freedom in the setting of the beam current range and the energy range in the individual beamline settings.

The first beamline setting S1 includes a first energy setting for the energy adjustment system 112 and a first beam current setting for the beam current adjustment system 114. The second beamline setting S2 includes a second energy setting for the energy adjustment system 112 and a second beam current setting for the beam current adjustment system 114. The first beamline setting S1 is directed to the low energy and high-dose ion implantation, and the second beamline setting S2 is directed to the high energy and low-dose ion implantation.

Therefore, the first energy setting is determined to be suitable for the transport of the low energy beam as compared with the second energy setting. Also, the second beam current setting is determined to reduce the beam current of the ion beam as compared with the first beam current setting. By combining the beam current adjustment and the irradiation time adjustment of the implantation ion beam B2, a desired dose amount can be implanted into the substrate W.

The first energy setting includes a first power supply connection setting that determines the connection between the energy adjustment system 112 and the power supply system thereof. The second energy setting includes a second power supply connection setting that determines the connection between the energy adjustment system 112 and the power supply system thereof. The power supply connection settings are determined such that the intermediate adjustment element 120 and/or the downstream adjustment element 122 generate an electric field for helping the beam transport. For example, the beam parallelizing device and/or the acceleration/deceleration column, as a whole, are configured to decelerate the implantation ion beam B2 under the first energy setting and accelerate the implantation ion beam B2 under the second energy setting. Due to the power supply connection settings, a voltage adjustment range of each adjustment element of the energy adjustment system 112 is determined. In the adjustment range, a voltage of the power supply corresponding to each adjustment element can be adjusted to provide a desired implantation energy to the implantation ion beam B2.

The first beam current setting includes a first opening setting that determines the ion beam passage region of the beam current adjustment element 124. The second beam current setting includes a second opening setting that determines the ion beam passage region of the beam current adjustment element 124. The second opening setting is determined such that the ion beam passage region is small as compared with the first opening setting. The opening settings determine, for example, the movable range of the movable portion of the beam current adjustment element 124. Alternatively, the opening settings may determine the adjustment member to be used. In this manner, the ion beam passage region corresponding to the desired beam current within the adjustment range determined by the opening settings may be set to the beam current adjustment element 124. The ion beam passage region can be adjusted such that a desired dose amount is implanted into the substrate W within a processing time permitted to the ion implantation processing.

Thus, the beamline device 104 has a first energy adjustment range under the first beamline setting S1 and has a second energy adjustment range under the second beamline setting S2. In order to enable a broad range of the adjustment, the first energy adjustment range has a portion overlapping the second energy adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first energy adjustment range may be separated from the second energy adjustment range.

Likewise, the beamline device 104 has a first dose adjustment range under the first beamline setting S1 and has a second dose adjustment range under the second beamline setting S2. The first dose adjustment range has a portion overlapping the second dose adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first dose adjustment range may be separated from the second dose adjustment range.

In this manner, the beamline device 104 is operated in a first operation mode under the first beamline setting S1. The first operation mode may be referred to as a low energy mode (or a high-dose mode). Also, the beamline device 104 is operated in a second operation mode under the second beamline setting S2. The second operation mode may be referred to as a high energy mode (or a low-dose mode). The first beamline setting S1 can be also referred to as a first implantation setting configuration suitable for the transport of a low energy/high-current beam for the high-dose implantation into the workpiece W. The second beamline setting S2 can be also referred to as a second implantation setting configuration suitable for the transport of a high energy/low-current beam for the low-dose implantation into the workpiece W.

An operator of the ion implantation apparatus 100 can switch the beamline settings before a certain ion implantation processing is performed, depending on the implantation conditions of the processing. Therefore, the broad range from the low energy (or high-dose) to the high energy (or low-dose) can be processed by one ion implantation apparatus.

Also, the ion implantation apparatus 100 corresponds to the broad range of the implantation conditions in the same implantation method. That is, the ion implantation apparatus 100 processes a broad range with substantially the same beamline device 104. Also, the ion implantation apparatus 100 has the serial-type configuration that is recently becoming the mainstream. Therefore, although details will be described below, the ion implantation apparatus 100 is suitable for use as a shared unit of the existing ion implantation apparatuses (for example, HC and MC).

The beamline device 104 can also be considered to include a beam control device for controlling the ion beam, a beam conditioning device for conditioning the ion beam, and a beam shaping device for shaping the ion beam. The beamline device 104 supplies the ion beam having the beam irradiation region 105 exceeding the width of the workpiece W in the implantation processing chamber 106 by using the beam control device, the beam conditioning device, and the beam shaping device. In the ion implantation apparatus 100, the beam control device, the beam conditioning device, and the beam shaping device may have the same hardware configuration in the first beamline setting S1 and the second beamline setting S2. In this case, the beam control device, the beam conditioning device, and the beam shaping device may be disposed with the same layout in the first beamline setting S1 and the second beamline setting S2. Therefore, the ion implantation apparatus 100 may have the same installation floor area (so-called footprint) in the first beamline setting S1 and the second beamline setting S2.

The beam center trajectory being the reference is a beam trajectory that is a locus of geometric center of the beam cross-section without beam scanning in the beam scanning method. Also, in the case of the ribbon beam that is a stationary beam, the beam center trajectory being the reference corresponds to a locus of a geometric center of the beam cross-section, regardless of a change in the beam cross-sectional shape in the implantation ion beam B2 of the downstream part.

The beam control device may include the control unit 116. The beam conditioning device may include the beam irradiation region determination unit 110. The beam conditioning device may include an energy filter or a deflection element. The beam shaping device may include a first XY convergence lens 206, a second XY convergence lens 208, and a Y convergence lens 210, which are to be described below.

It can be considered that, in the case of the beam scanning method, the initial ion beam B1 takes a single beam trajectory in the upstream part of the beamline device 104, and in the downstream part the implantation ion beam B2 takes a plurality of beam trajectories due to the beam scanning and parallelizing with reference to the beam center trajectory being the reference. However, in the case of the ribbon beam, it becomes a beam irradiation zone because the beam cross-sectional shape of the single beam trajectory is changed and the beam width is widened. Thus, the beam trajectory is also single. According to this view, the beam irradiation region 105 may be also referred to as an ion beam trajectory zone. Therefore, in the ion implantation apparatus 100, the implantation ion beam B2 has the same ion beam trajectory zone in the first beamline setting S1 and the second beamline setting S2.

Figure 4:
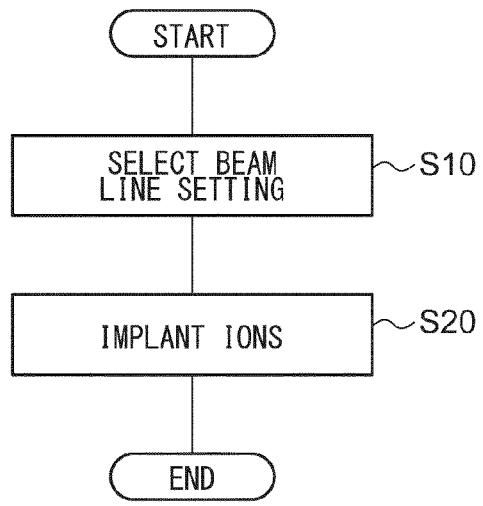
FIG. 4 is a flowchart illustrating an ion implantation method according to an embodiment of the present invention.

FIG. 4 is a flowchart illustrating an ion implantation method according to an embodiment of the present invention. This ion implantation method is suitable for use in the ion implantation apparatus 100. This method is performed by the control unit 116. As illustrated in FIG. 4, this method includes a beamline setting selecting step (S10) and an ion implantation step (S20).

The control unit 116 selects a beamline setting suitable for given ion implantation conditions among a plurality of beamline settings (S10). As described above, the plurality of beamline settings includes a first beamline setting S1 suitable for transport of a high-current beam for high-dose implantation into a workpiece, and a second beamline setting S2 suitable for transport of a low-current beam for low-dose implantation into a workpiece. For example, the control unit 116 selects the first beamline setting S1 when a desired ion dose amount implanted into a substrate W exceeds a threshold value, and selects the second beamline setting S2 when the desired ion dose amount is smaller than the threshold value. Also, as described below, the plurality of beamline settings (or implantation setting configurations) may include a third beamline setting (or third implantation setting configuration) and/or a fourth beamline setting (or fourth implantation setting configuration).

When the first beamline setting S1 is selected, the control unit 116 sets the energy adjustment system 112 by using the first energy setting. The energy adjustment system 112 and the power supply thereof are connected according to a first power supply connection setting. Also, the control unit 116 sets the beam current adjustment system 114 by using the first beam current setting. Therefore, the ion beam passage region (or adjustment range thereof) is set according to the first opening setting. Likewise, when the second beamline setting S2 is selected, the control unit 116 sets the energy adjustment system 112 by using the second energy setting, and sets the beam current adjustment system 114 by using the second beam current setting.

The selecting process step may include a process step of adjusting the beamline device 104 in the adjustment range according to the selected beamline setting. In the adjusting process step, each adjustment element of the beamline device 104 is adjusted within a corresponding adjustment range so as to generate the ion beam of a desired implantation condition. For example, the control unit 116 determines a voltage of a power supply corresponding to each adjustment element of the energy adjustment system 112 so as to obtain a desired implantation energy. Also, the control unit 116 determines the ion beam passage region of the beam current adjustment element 124 so as to obtain a desired implantation dose amount.

In this manner, the control unit 116 operates the ion implantation apparatus 100 under the selected beamline setting (S20). The implantation ion beam B2 having the beam irradiation region 105 is generated and supplied to the substrate W. The implantation ion beam B2 scans the entire substrate W in cooperation with the mechanical scanning of the substrate W (or with the beam alone). As a result, ions are implanted into the substrate W at the energy and dose amount of the desired ion implantation conditions.

The serial-type high-dose high-current ion implantation apparatus, which is being used in device production, currently adopts a hybrid scanning method, a two-dimensional mechanical scanning method, and a ribbon beam+wafer scanning method. However, the two-dimensional mechanical scanning method has a limitation in increase of a scanning speed due to a load of mechanical driving mechanism of the mechanical scanning, and thus, the two-dimensional mechanical scanning method disadvantageously cannot suppress implantation non-uniformity sufficiently. Also, in the ribbon beam+wafer scanning method, uniformity is easily degraded when the beam size is expanded in a horizontal direction. Therefore, in particular, there are problems in the uniformity and the identity of beam angle in the low-dose condition (low beam current condition). However, when the obtained implantation result is within an allowable range, the ion implantation apparatus of the present invention may be configured by the two-dimensional mechanical scanning method or the ribbon beam+wafer scanning method.

On the other hand, the hybrid scanning method can achieve excellent uniformity in the beam scanning direction by adjusting the bean scanning speed at high accuracy. Also, by performing the beam scanning at a sufficient high speed, implantation non-uniformity in the wafer scanning direction can be sufficiently suppressed. Therefore, the hybrid scanning method is considered as optimal over a broad range of the dose condition.

FIG. 5A is a plan view illustrating a schematic configuration of an ion implantation apparatus 200 according to an embodiment of the present invention, and FIG. 5B is a side view illustrating a schematic configuration of an ion implantation apparatus 200 according to an embodiment of the present invention. The ion implantation apparatus 200 is an embodiment when the hybrid scanning method is applied to the ion implantation apparatus 100 illustrated in FIG. 2. Also, like the ion implantation apparatus 100 illustrated in FIG. 2, the ion implantation apparatus 200 is a serial-type apparatus.

As illustrated, the ion implantation apparatus 200 includes a plurality of beamline components. The beamline upstream part of the ion implantation apparatus 200 includes, in order from the upstream side, an ion source 201, a mass analysis magnet 202, a beam dump 203, a resolving aperture 204, a current suppression mechanism 205, a first XY convergence lens 206, a beam current measurement device 207, and a second XY convergence lens 208. An extraction electrode 218 (see FIGS. 6 and 7) for extracting ions from the ion source 201 is provided between the ion source 201 and the mass analysis magnet 202.

A scanner 209 is provided between the beamline upstream part and the beamline downstream part. The beamline downstream part includes, in order from the upstream side, a Y convergence lens 210, a beam parallelizing mechanism 211, an AD (Accel/Decel) column 212, and an energy filter 213. A wafer 214 is disposed in the most downstream part of the beamline downstream part. The beamline components from the ion source 201 to the beam parallelizing mechanism 211 are accommodated in a terminal 216.

The current suppression mechanism 205 is an example of the above-described beam current adjustment system 114. The current suppression mechanism 205 is provided for switching a low-dose mode and a high-dose mode. The current suppression mechanism 205 includes, for example, a continuously variable aperture (CVA). The CVA is an aperture capable of adjusting an opening size by a driving mechanism. Therefore, the current suppression mechanism 205 is configured to operate in a relatively small opening size adjustment range in the low-dose mode, and operate in a relatively large opening size adjustment range in the high-dose mode. In an embodiment, in addition or alternative to the current suppression mechanism 205, a plurality of resolving apertures 204 having different opening widths may be configured to operate with different settings in the low-dose mode and the high-dose mode.

The current suppression mechanism 205 serves to help beam adjustment under the low beam current condition by limiting an ion beam amount arriving at the downstream. The current suppression mechanism 205 is provided in the beamline upstream part (that is, from the ion extraction from the ion source 201 to the upstream side of the scanner 209). Therefore, the beam current adjustment range can be increased. Also, the current suppression mechanism 205 may be provided in the beamline downstream part.

The beam current measurement device 207 is, for example, a movable flag Faraday.

The first XY convergence lens 206, the second XY convergence lens 208, and the Y convergence lens 210 constitute the beam shaping device for adjusting the beam shape in the vertical and horizontal directions (beam cross-section in an XY plane). As such, the beam shaping device includes a plurality of lenses arranged along the beamline between the mass analysis magnet 202 and the beam parallelizing mechanism 211. The beam shaping device can use the convergence/divergence effect of these lenses in order to appropriately transport the ion beam up to the downstream in a broad range of energy/beam current condition. That is, the ion beam can be appropriately transported to the wafer 214 in any condition of low energy/low beam current, low energy/high beam current, high energy/low beam current, and high energy/high beam current.

The first XY convergence lens 206 is, for example, a Q lens. The second XY convergence lens 208 is, for example, an XY-direction einzel lens. The Y convergence lens 210 is, for example, a Y-direction einzel lens or Q lens. Each of the first XY convergence lens 206, the second XY convergence lens 208, and the Y convergence lens 210 may be a single lens or a group of lenses. In this manner, the beam shaping device is designed to appropriately control the ion beam from the low energy/high beam current condition having a beam self-divergence problem caused by a large beam potential to the high energy/low beam current having a beam cross-sectional shape control problem caused by a small beam potential.

The energy filter 213 is, for example, an angular energy filter (AEF) having a deflection electrode or a deflection electromagnet, or both of the defection electrode and the deflection electromagnet.

The ions generated in the ion source 201 are accelerated with an extraction electric field (not illustrated). The accelerated ions are deflected in the mass analysis magnet 202. In this manner, only ions having a predetermined energy and a mass-to-charge ratio pass through the resolving aperture 204. Subsequently, the ions are guided to the scanner 209 through the current suppression mechanism (CVA) 205, the first XY convergence lens 206, and the second XY convergence lens 208.

The scanner 209 reciprocally scans the ion beam in a horizontal direction (which may be a vertical direction or an oblique direction) by applying either (or both) of a periodic electric field and a periodic magnetic field. Due to the scanner 209, the ion beam is adjusted such that the ion beam is uniformly implanted in a horizontal direction on the wafer 214. The traveling direction of the ion beam 215 with which the scanner 209 scans can be parallelized by the beam parallelizing mechanism 211 using the application of either (or both) of the electric field and the magnetic field. Thereafter, the ion beam 215 is accelerated or decelerated to have a predetermined energy in the AD column 212 by applying the electric field. The ion beam 215 exiting the AD column 212 reaches the final implantation energy (in the low energy mode, the energy may be adjusted to be higher than the implantation energy, and the ion beam may be deflected while decelerating in the energy filter). The energy filter 213 in the downstream of the AD column 212 deflects the ion beam 215 to the wafer 214 by the application of either (or both) of the electric field and the magnetic field with the deflection electrode or the deflection electromagnet. Thus, a contamination with energy other than target energy is eliminated. In this manner, the purified ion beam 215 is implanted into the wafer 214.

Also, the beam dump 203 is disposed between the mass analysis magnet 202 and the resolving aperture 204. The beam dump 203 deflects the ion beam by applying the electric field when necessary. Therefore, the beam dump 203 can control the arrival of the ion beam at the downstream at high speed.

Figure 5:
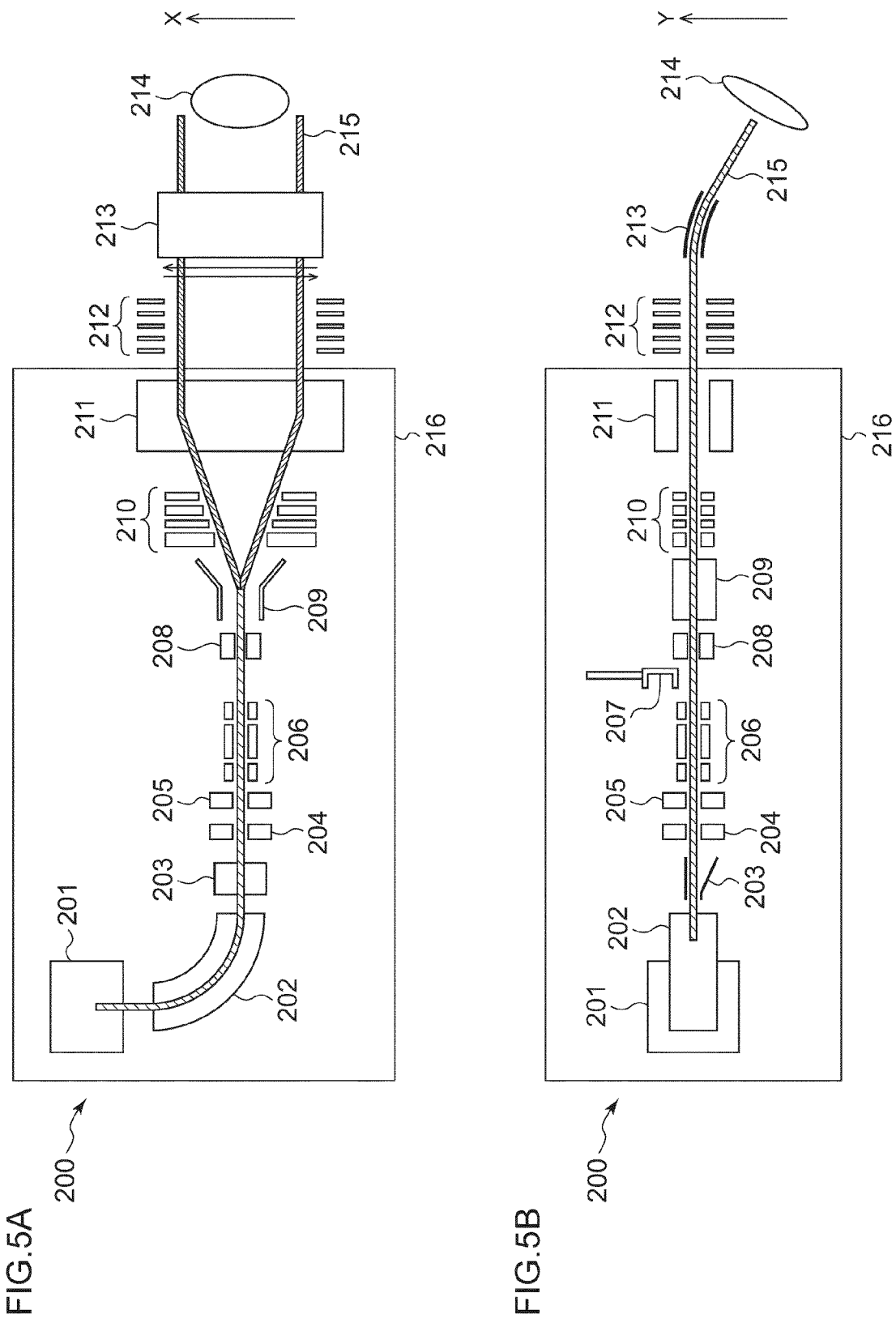
FIG. 5A is a plan view illustrating a schematic configuration of an ion implantation apparatus according to an embodiment of the present invention.
FIG. 5B is a side view illustrating a schematic configuration of an ion implantation apparatus according to an embodiment of the present invention.
Figure 6:
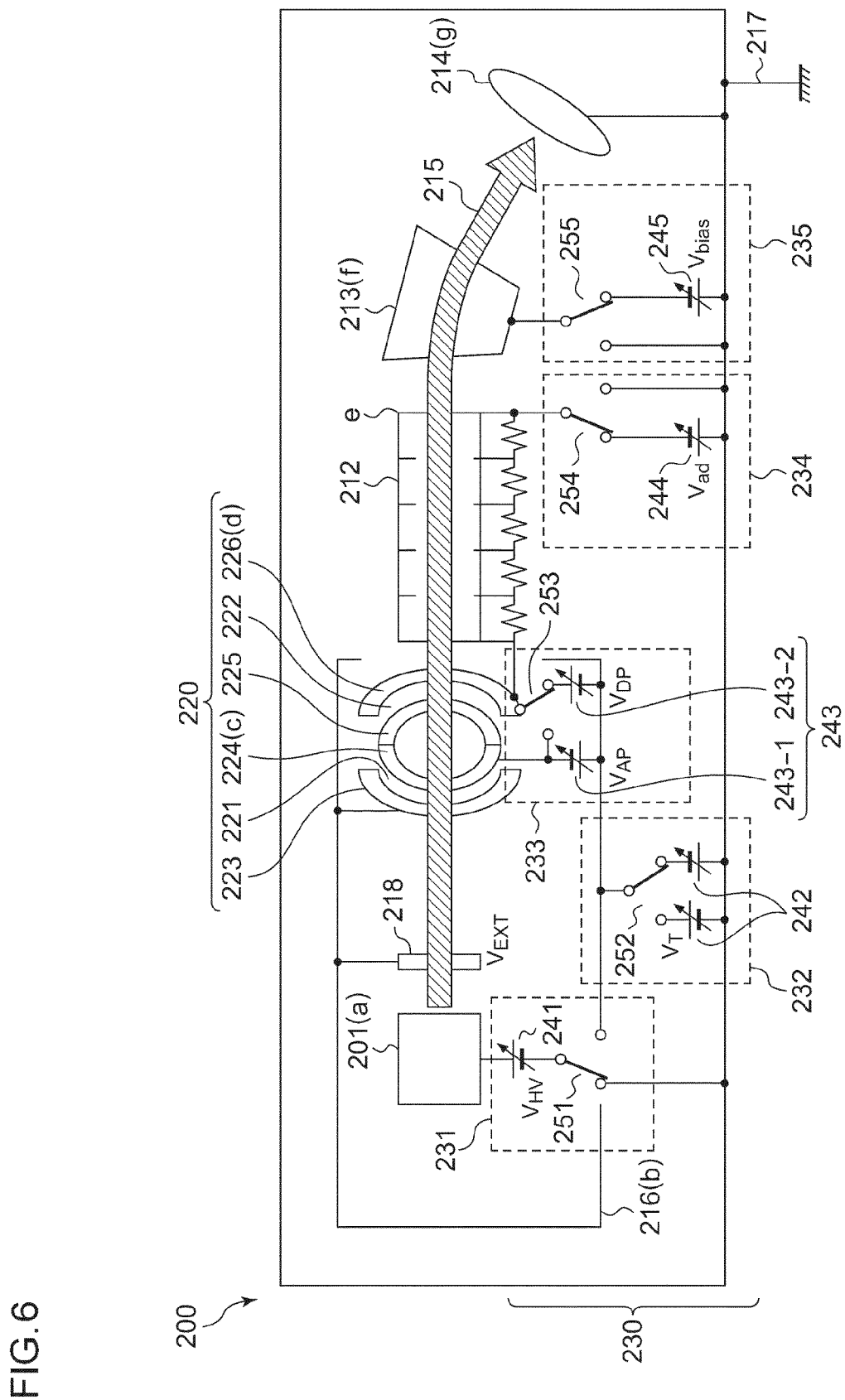
FIG. 6 is a diagram schematically illustrating a configuration of a power supply of an ion implantation apparatus according to an embodiment of the present invention.
Figure 7:
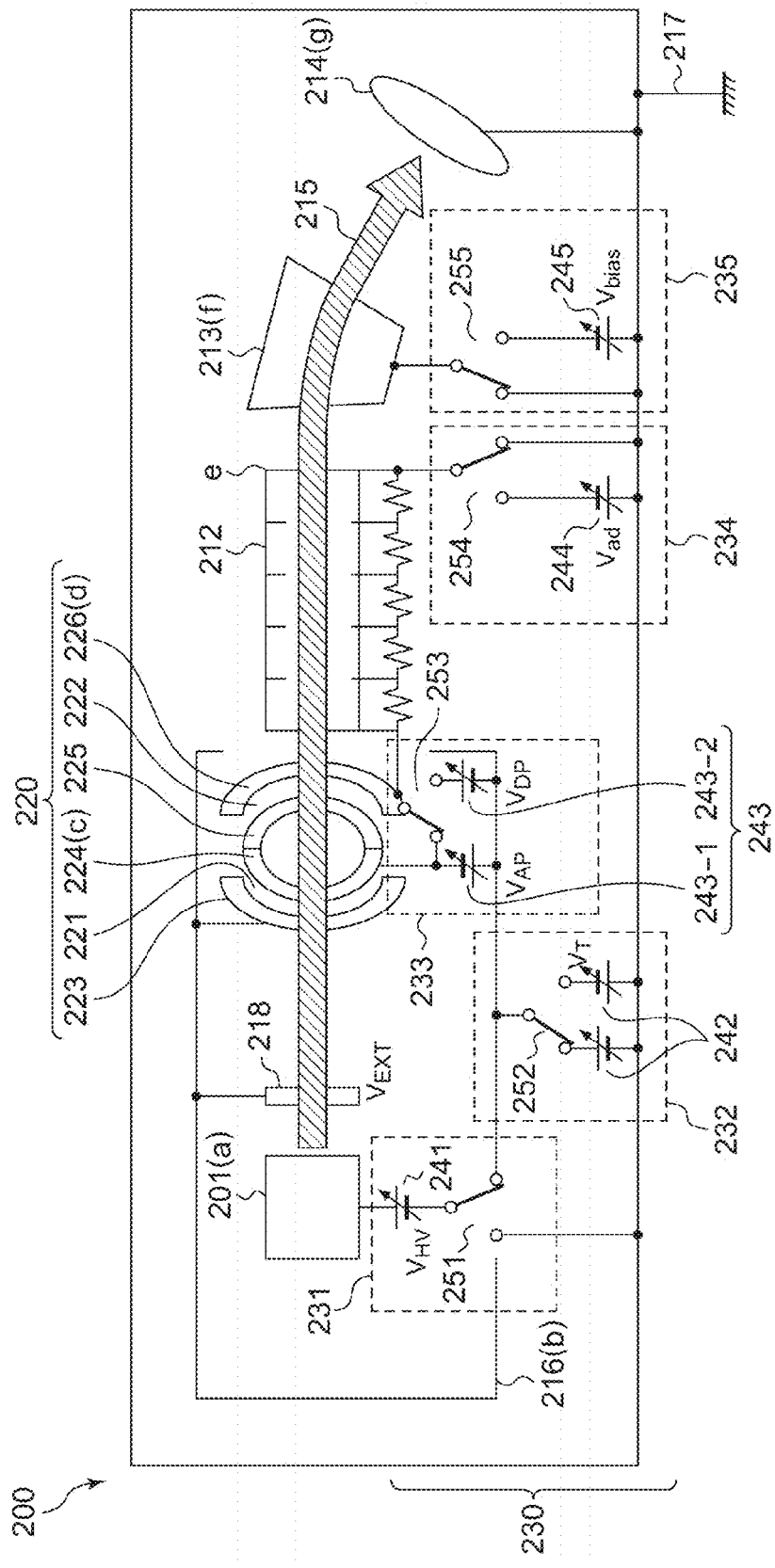
FIG. 7 is a diagram schematically illustrating a configuration of a power supply of an ion implantation apparatus according to an embodiment of the present invention.

Next, the low energy mode and the high energy mode in the ion implantation apparatus 200 illustrated in FIG. 5 will be described with reference to the configuration system diagram of the high-voltage power supply system 230 illustrated in FIGS. 6 and 7. FIG. 6 illustrates a power supply switching state of the low energy mode, and FIG. 7 illustrates a power supply switching state of the high energy mode. FIGS. 6 and 7 illustrate main components related to the energy adjustment of the ion beam among the beamline components illustrated in FIG. 5. In FIGS. 6 and 7, the ion beam 215 is indicated by an arrow.

As illustrated in FIGS. 6 and 7, the beam parallelizing mechanism 211 (see FIG. 5) includes a double P lens 220. The double P lens 220 includes a first voltage gap 221 and a second voltage gap 222 disposed spaced apart from each other along the ion movement direction. The first voltage gap 221 is disposed in the upstream, and the second voltage gap 222 is disposed in the downstream.

The first voltage gap 221 is formed between a pair of electrodes 223 and 224. The second voltage gap 222 is formed between another pair of electrodes 225 and 226 disposed in the downstream of the electrodes 223 and 224. The first voltage gap 221 and the electrodes 223 and 224 forming the gap 221 have a convex shape toward the upstream side. Conversely, the second voltage gap 222 and the electrodes 225 and 226 forming the gap 222 have a convex shape toward the downstream side. Also, for convenience of description, these electrodes may be also referred to as a first P lens upstream electrode 223, a first P lens downstream electrode 224, a second P lens upstream electrode 225, and a second P lens downstream electrode 226 below.

The double P lens 220 parallelizes the incident ion beam before emission and adjusts the energy of the ion beam by a combination of the electric fields applied to the first voltage gap 221 and the second voltage gap 222. That is, the double P lens 220 accelerates or decelerates the ion beam by the electric fields of the first voltage gap 221 and the second voltage gap 222.

Also, the ion implantation apparatus 200 includes a high-voltage power supply system 230 including a power supply for the beamline components. The high-voltage power supply system 230 includes a first power supply unit 231, a second power supply unit 232, a third power supply unit 233, a fourth power supply unit 234, and a fifth power supply unit 235. As illustrated, the high-voltage power supply system 230 includes a connection circuit for connecting the first to fifth power supply units 231 to 235 to the ion implantation apparatus 200.

The first power supply unit 231 includes a first power supply 241 and a first switch 251. The first power supply 241 is provided between the ion source 201 and the first switch 251, and is a DC power supply that provides the ion source 201 with a positive voltage. The first switch 251 connects the first power supply 241 to a ground 217 in the low energy mode (see FIG. 6), and connects the first power supply 241 to a terminal 216 in the high energy mode (see FIG. 7). Therefore, the first power supply 241 provides a voltage $V_{HV}$ to the ion source 201 in the low energy mode on the basis of a ground potential. This provides the total ion energy as it is. On the other hand, the first power supply 241 provides a voltage $V_{HV}$ to the ion source 201 in the high energy mode on the basis of a terminal potential.

The second power supply unit 232 includes a second power supply 242 and a second switch 252. The second power supply 242 is provided between the terminal 216 and the ground 217, and is a DC power supply that provides the terminal 216 with one of positive and negative voltages by the switching of the second switch 252. The second switch 252 connects a negative electrode of the second power supply 242 to the terminal 216 in the low energy mode (see FIG. 6), and connects a positive electrode of the second power supply 242 to the terminal 216 in the high energy mode (see FIG. 7). Therefore, the second power supply 242 provides a voltage $V_T$ ($V_T$<0) to the terminal 216 in the low energy mode on the basis of the ground potential. On the other hand, the second power supply 242 provides a voltage $V_T$ ($V_T$>0) to the terminal 216 in the high energy mode on the basis of the ground potential.

Therefore, an extraction voltage $V_{EXT}$ of the extraction electrode 218 is $V_{EXT}=V_{HV}-V_T$ in the low energy mode, and is $V_{EXT}=V_{HV}$ in the high energy mode. When a charge of an ion is q, the final energy is $qV_{HV}$ in the low energy mode, and is $q(V_{HV}+V_T)$ in the high energy mode.

The third power supply unit 233 includes a third power supply 243 and a third switch 253. The third power supply 243 is provided between the terminal 216 and the double P lens 220. The third power supply 243 includes a first P lens power supply 243-1 and a second P lens power supply 243-2. The first P lens power supply 243-1 is a DC power supply that provides a voltage $V_{AP}$ to the first P lens downstream electrode 224 and the second P lens upstream electrode 225 on the basis of the terminal potential. The second P lens power supply 243-2 is a DC power supply that provides a voltage $V_{DP}$ to a destination through the third switch 253 on the basis of the terminal potential. The third switch 253 is provided between the terminal 216 and the double P lens 220 to connect one of the first P lens power supply 243-1 and the second P lens power supply 243-2 to the second P lens downstream electrode 226 by the switching. Also, the first P lens upstream electrode 223 is connected to the terminal 216.

The third switch 253 connects the second P lens power supply 243-2 to the second P lens downstream electrode 226 in the low energy mode (see FIG. 6), and connects the first P lens power supply 243-1 to the second P lens downstream electrode 226 in the high energy mode (see FIG. 7). Therefore, the third power supply 243 provides a voltage $V_{DP}$ to the second P lens downstream electrode 226 in the low energy mode on the basis of the terminal potential. On the other hand, the third power supply 243 provides a voltage $V_{AP}$ to the second P lens downstream electrode 226 in the high energy mode on the basis of the terminal potential.

The fourth power supply unit 234 includes a fourth power supply 244 and a fourth switch 254. The fourth power supply 244 is provided between the fourth switch 254 and the ground 217 and is a DC power supply that provides a negative voltage to an exit (that is, the downstream end) of the AD column 212. The fourth switch 254 connects the fourth power supply 244 to the exit of the AD column 212 in the low energy mode (see FIG. 6), and connects the exit of the AD column 212 to the ground 217 in the high energy mode (see FIG. 7). Therefore, the fourth power supply 244 provides a voltage $V_{ad}$ to the exit of the AD column 212 in the low energy mode on the basis of the ground potential. On the other hand, the fourth power supply 244 is not used in the high energy mode.

The fifth power supply unit 235 includes a fifth power supply 245 and a fifth switch 255. The fifth power supply 245 is provided between the fifth switch 255 and the ground 217. The fifth power supply 245 is provided for the energy filter (AEF) 213. The fifth switch 255 is provided for switching the operation modes of the energy filter 213. The energy filter 213 is operated in a so-called offset mode in the low energy mode, and is operated in a normal mode in the high energy mode. The offset mode is an operation mode of the AEF in which an average value of the positive electrode and the negative electrode is a negative potential. The beam convergence effect of the offset mode can prevent beam loss caused by the beam divergence in the AEF. The normal mode is an operation mode of the AEF in which an average value of the positive electrode and the negative electrode is the ground potential.

The ground potential is provided to the wafer 214.

Figure 8A:
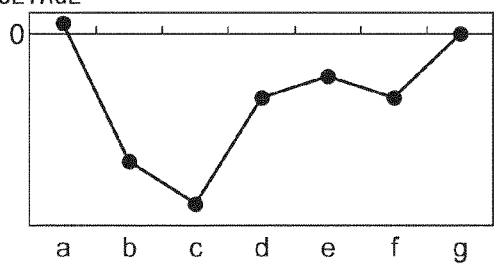
FIG. 8A is a diagram illustrating a voltage in an ion implantation apparatus according to an embodiment of the present invention.
Figure 8B:
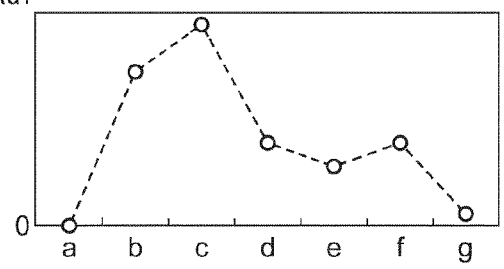
FIG. 8B is a diagram illustrating an energy in an ion implantation apparatus according to an embodiment of the present invention.
Figure 9A:
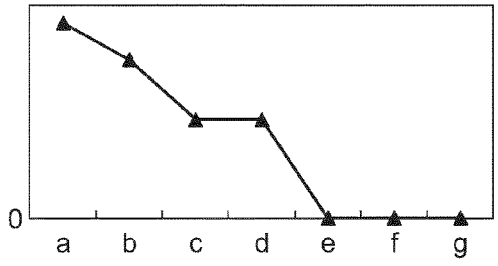
FIG. 9A is a diagram illustrating a voltage in an ion implantation apparatus according to an embodiment of the present invention.
Figure 9B:
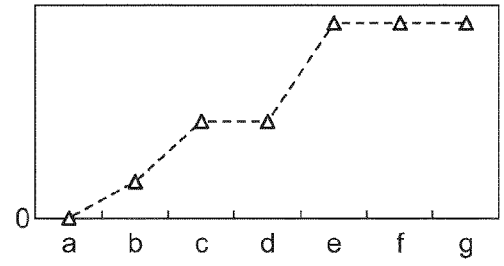
FIG. 9B is a diagram illustrating an energy in an ion implantation apparatus according to an embodiment of the present invention.

FIG. 8A illustrates an example of a voltage applied to each portion of the ion implantation apparatus 200 in the low energy mode, and FIG. 8B illustrates an example of energy of the ion in each portion of the ion implantation apparatus 200 in the low energy mode. FIG. 9A illustrates an example of a voltage applied to each portion of the ion implantation apparatus 200 in the high energy mode, and FIG. 9B illustrates an example of energy of the ion in each portion of the ion implantation apparatus 200 in the high energy mode. The vertical axes in FIGS. 8A and 9A represent the voltage, and the vertical axes in FIGS. 8B and 9B represent the energy. In the horizontal axes of the respective drawings, locations in the ion implantation apparatus 200 are represented by symbols a to g. The symbols a, b, c, d, e, f, and g represent the ion source 201, the terminal 216, the acceleration P lens (first P lens downstream electrode 224), the deceleration P lens (second P lens downstream electrode 226), the exit of the AD column 212, the energy filter 213, and the wafer 214, respectively.

The double P lens 220 has a configuration that uses the acceleration P lens c alone, or uses the deceleration P lens d alone, or uses both of the acceleration P lens c and the deceleration P lens d, when necessary according to the implantation condition. In the configuration that uses both of the acceleration P lens c and the deceleration P lens d, the double P lens 220 can be configured to change the distribution of the acceleration and deceleration effects by using both of the acceleration effect and the deceleration effect. In this case, the double P lens 220 can be configured such that a difference between the incident beam energy to the double P lens 220 and the exit beam energy from the double P lens 220 is used to accelerate or decelerate the beam. Alternatively, the double P lens 220 can be configured such that the difference between the incident beam energy and the exit beam energy becomes zero, and thus, the beam is neither accelerated nor decelerated.

As an example, as illustrated, in the low energy mode, the double P lens 220 is configured to decelerate the ion beam in the deceleration P lens d, accelerate the ion beam in the acceleration P lens c to some extent when necessary, and thereby the ion beam is decelerated as a whole. On the other hand, in the high energy mode, the double P lens 220 is configured to accelerate the ion beam only in the acceleration P lens c. Also, in the high energy mode, the double P lens 220 may be configured to decelerate the ion beam in the deceleration P lens d to some extent when necessary, as long as the ion beam is accelerated as a whole.

Since the high-voltage power supply system 230 is configured as above, the voltages applied to several regions on the beamline can be changed by the switching of the power supply. Also, the voltage application paths in some regions can also be changed. By using these, it is possible to switch the low energy mode and the high energy mode in the same beamline.

In the low energy mode, the potential $V_{HV}$ of the ion source 201 is directly applied on the basis of the ground potential. Therefore, a high-accuracy voltage application to the source unit is possible, and the accuracy of energy setting can be increased during the ion implantation at low energy. Also, by setting the terminal voltage $V_T$, the P lens voltage $V_{DP}$, the AD column exit voltage $V_{ad}$, and the energy filter voltage $V_{bias}$ to negative, it is possible to transport the ions to the energy filter at a relatively high energy. Therefore, the transport efficiency of the ion beam can be improved, and the high current can be obtained.

Also, in the low energy mode, the deceleration P lens is employed to facilitate the ion beam transport in the high energy state. This helps the low energy mode coexist with the high energy mode in the same beamline. Also, in the low energy mode, an expanded beam by design is generated by adjusting the convergence/divergence elements of the beamline in order to transport the beam such that the self-divergence of the beam is minimized. This also helps the low energy mode coexist with the high energy mode in the same beamline.

In the high energy mode, the potential of the ion source 201 is the sum of the acceleration extraction voltage $V_{HV}$ and the terminal potential $V_T$. This can enable the application of the high voltage to the source unit, and accelerate ions at high energy.

Figure 10:
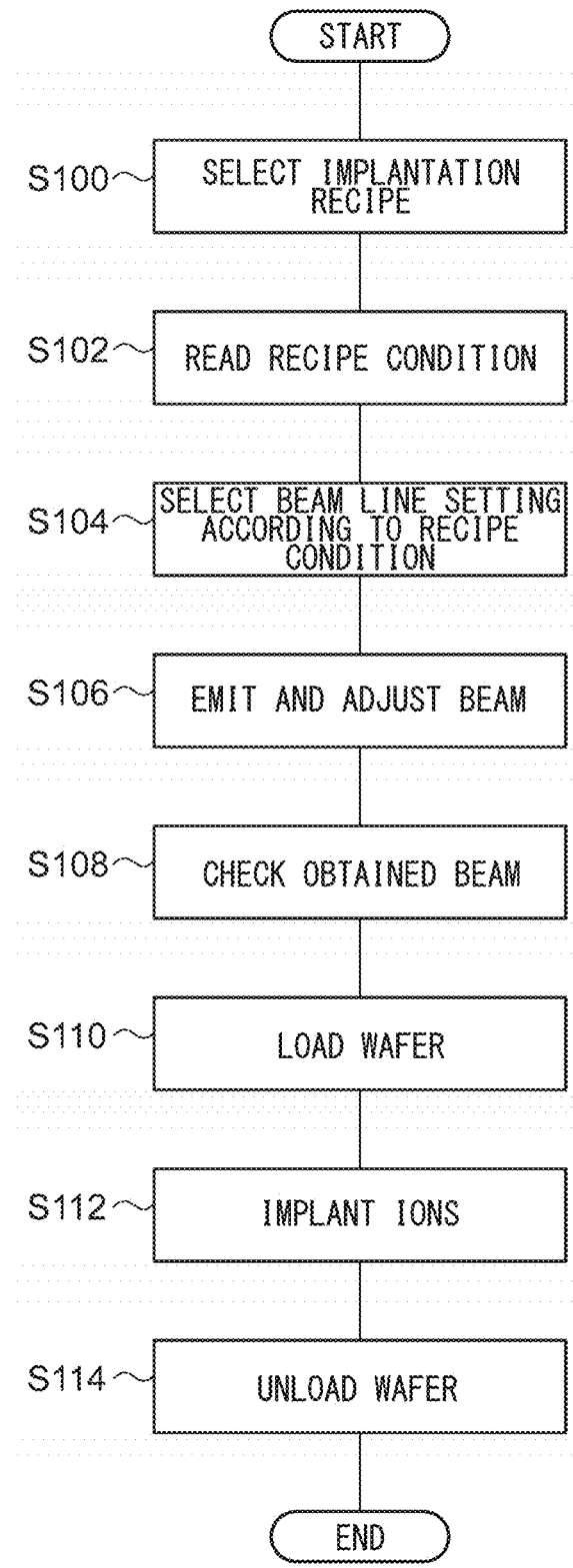
FIG. 10 is a flowchart illustrating an ion implantation method according to an embodiment of the present invention.

FIG. 10 is a flowchart illustrating an ion implantation method according to an embodiment of the present invention. This method may be performed by, for example, the beam control device for the ion implantation apparatus. As illustrated in FIG. 10, first, the implantation recipe is selected (S100). The control device reads the recipe condition (S102), and selects the beamline setting according to the recipe condition (S104). The ion beam adjusting process is performed under the selected beamline setting. The adjusting process includes a beam emission and adjustment (S106) and an obtained beam checking (S108). In this manner, the preparing process for the ion implantation is ended. Next, the wafer is loaded (S110), the ion implantation is performed (S112), and the wafer is unloaded (S114). Steps 110 to 114 may be repeated until the desired number of wafers are processed.

Figure 11:
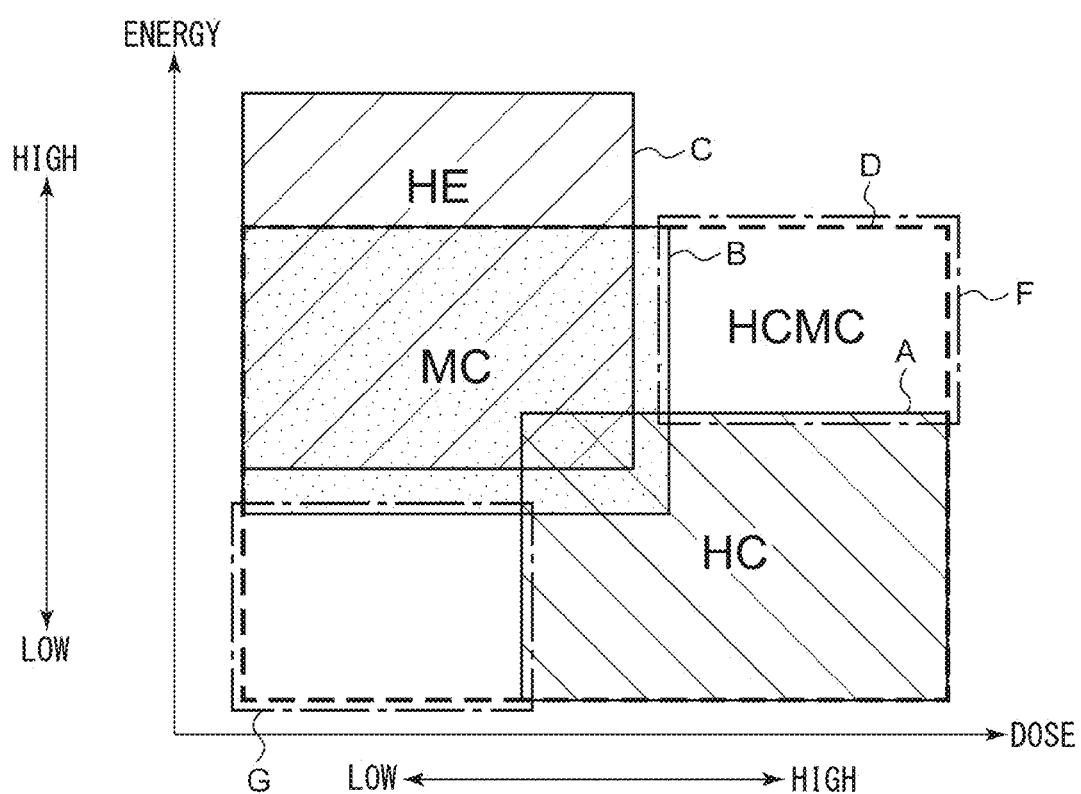
FIG. 11 is a diagram schematically illustrating ranges of an energy and a dose amount in an ion implantation apparatuses according to an embodiment of the present invention.
Figure 12:
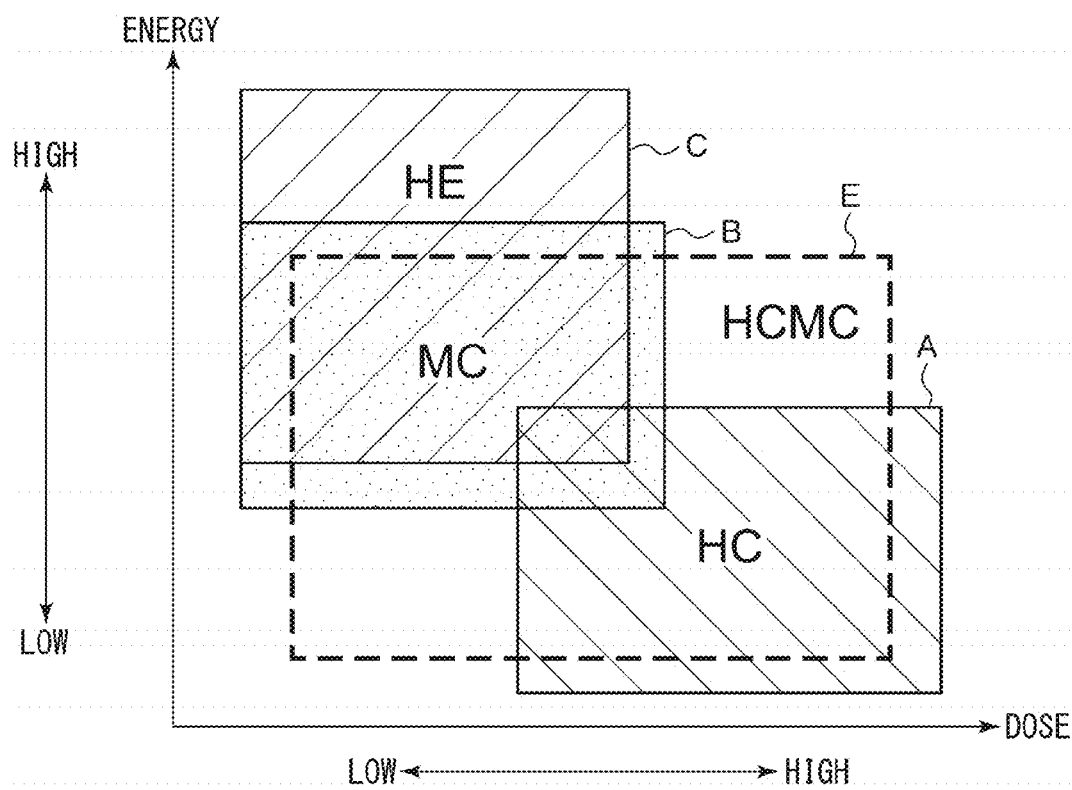
FIG. 12 is a diagram schematically illustrating ranges of an energy and a dose amount in an ion implantation apparatuses according to an embodiment of the present invention.

FIG. 11 schematically illustrates a range D of energy and dose amount that is realized by the ion implantation apparatus 200. Like in FIG. 1, FIG. 11 illustrates the range of energy and dose amount that can be processed in the actually allowable productivity. For comparison, ranges A, B and C of energy and dose amount of the HC, the MC, and the HE illustrated in FIG. 1 are illustrated in FIG. 11.

As illustrated in FIG. 11, it can be seen that the ion implantation apparatus 200 includes all the operation ranges of the existing apparatuses HC and MC. Therefore, the ion implantation apparatus 200 is a novel apparatus beyond the existing framework. Even one novel ion implantation apparatus can serve as the two existing types of categories HC and MC while maintaining the same beamline and the implantation method. Therefore, this apparatus may be referred to as HCMC.

Therefore, according to the present embodiment, it is possible to provide the HCMC in which the serial-type high-dose high-current ion implantation apparatus and the serial-type medium-dose medium-current ion implantation apparatus are configured as a single apparatus. The HCMC can perform the implantation in a broad range of energy condition and dose condition by changing the voltage applying method in the low energy condition and the high energy condition and changing the beam current from high current to low current in the CVA.

Also, the HCMC-type ion implantation apparatus may not include all the implantation condition ranges of the existing HC and MC. Considering the tradeoff of the device manufacturing cost and the implantation performance, it may be thought to provide an apparatus having a range E (see FIG.

12) narrower than the range D illustrated in FIG. 11. In this case, the ion implantation apparatus having excellent practicality can be provided as long as it covers the ion implantation conditions required for the device maker.

Figure 13:
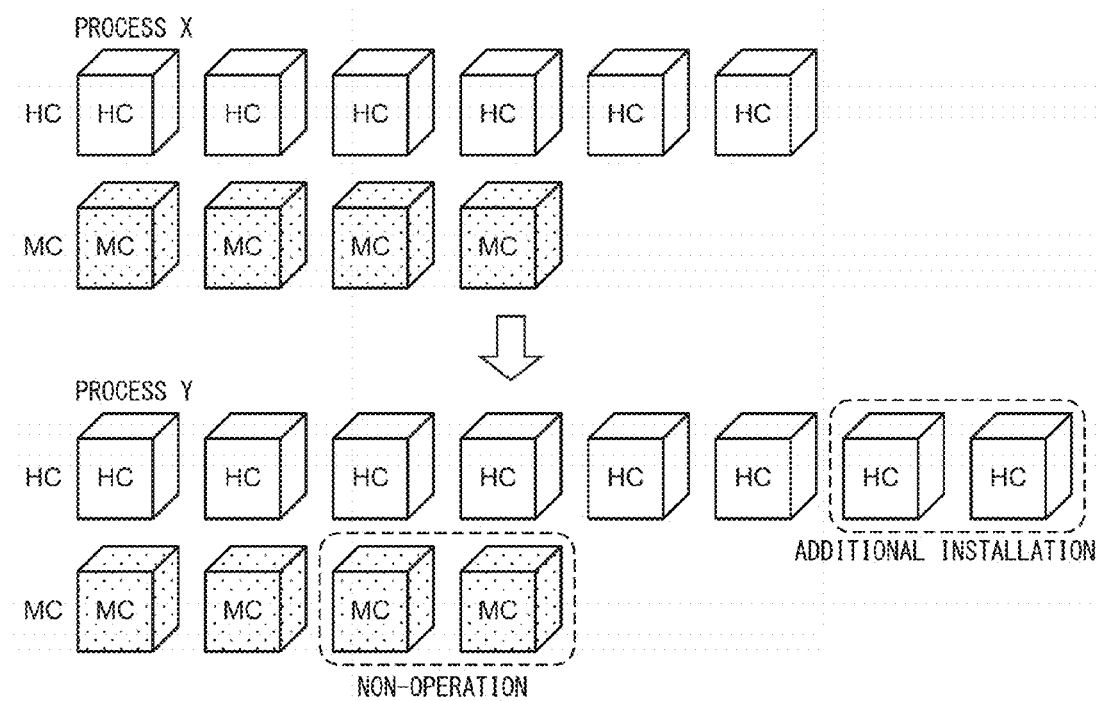
FIG. 13 is a diagram describing the use of a typical ion implantation apparatus.

The improvement in the operation efficiency of the apparatus realized by the HCMC in the device manufacturing process will be described. For example, as illustrated in FIG. 13, it is assumed that a device maker uses six HCs and four MCs in order to process a manufacturing process X (that is, this device maker owns only the existing apparatuses HC and MC). Thereafter, the device maker changes the process X to a process Y according to a change in a manufacturing device. As a result, the device maker needs eight HCs and two MCs. The maker needs to install two more HCs, and thus, the increase in investment and the lead time are required. At the same time, two MCs are not operated, and thus, the maker unnecessarily owns these. As described above, since the HC and the MC are generally different in the implantation method, it is difficult to convert the non-operating MCs to newly necessary HCs.

Figure 14:
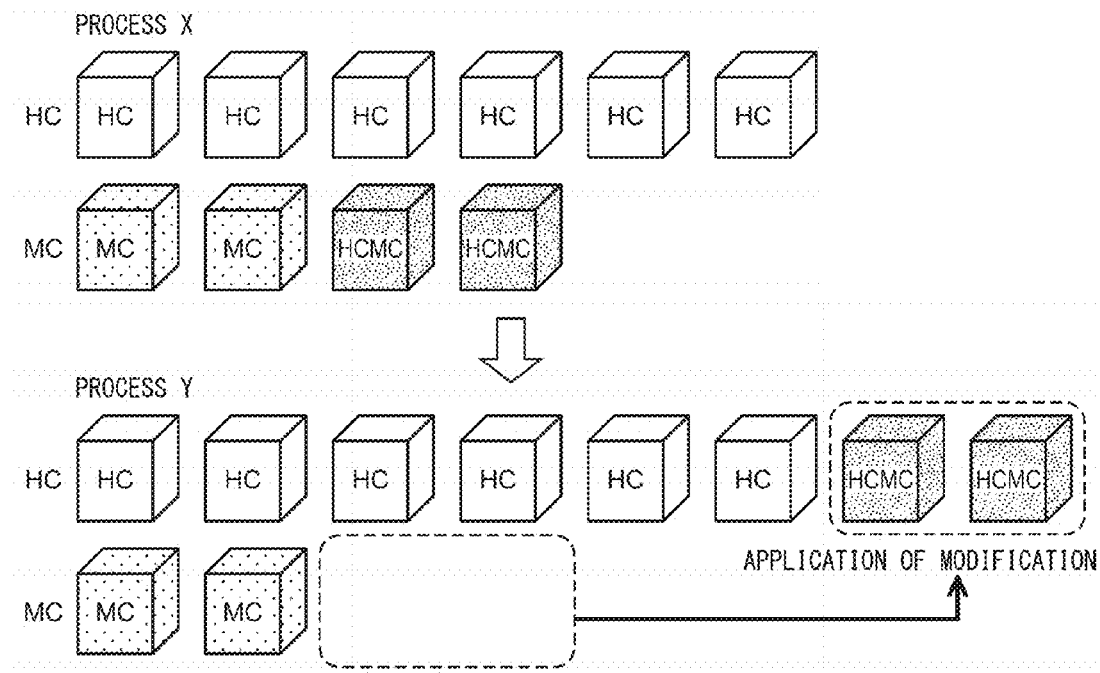
FIG. 14 is a diagram describing the use of an ion implantation apparatus according to an embodiment of the present invention.

Next, as illustrated in FIG. 14, it is considered that the device maker uses six HCs, two MCs, and two HCMCs in order to process the process X. In this case, even when the process X is changed to the process Y according to the change in the manufacturing device, the HCMC can be operated as the HC because the HCMC is the process shared machine of the HC and the MC. Therefore, additional equipment installation and non-operation are unnecessary.

As such, there is a great merit when the device maker owns a certain number of HCMCs. This is because the process change of HC and the MC can be absorbed by the HCMC. Also, when some apparatuses cannot be used due to malfunction or maintenance, the HCMC can also be used as the HC or the MC. Therefore, by owning the HCMC, the overall operating rate of the apparatus can be significantly improved.

Also, ultimately, it can be considered that all apparatuses are provided with HCMCs. However, in many cases, it is practical that part of the apparatuses are provided with HCMCs considering a price difference between the HCMC and the HC (or MC) or the utilization of the already owned HC or MC.

Also, when a type of the existing ion implantation apparatus is replaced with other apparatuses having different methods of implanting ions into the wafer in order for an ion implantation process to be performed, it may be difficult to match the implantation characteristics. This is because a beam divergence angle or a beam density may be different even though the energy and dose are matched in two types of ion implantation apparatuses for the ion implantation process. However, the HCMC can process the high-dose high-current ion implantation condition and the medium-dose medium-current ion implantation condition on the same beamline (the same ion beam trajectory). In this way the HCMC can separately use the high-dose high-current ion implantation condition and the medium-dose medium-current ion implantation condition. Therefore, it is expected to facilitate the matching because the change in the implantation characteristics followed by the replacement of the apparatus is sufficiently suppressed.

The HCMC is the shared machine of the HC and the MC and can also process the implantation condition out of the operation range of the existing HC or the MC. As illustrated in FIG. 11, the HCMC is a new apparatus that can also process the high energy/high dose implantation (right upper region F in the range D) and low energy/low dose implantation (left lower region G in the range D). Therefore, in addition or alternative to the first beamline setting S1 and the second beamline setting S2 described above, in an embodiment, the ion implantation apparatus may include a third beamline setting for high energy/high dose implantation and/or a fourth beamline setting for low energy/low dose implantation.

As described above, in the present embodiment, the beamlines of the serial-type high-dose high-current ion implantation apparatus and the serial-type medium-dose medium-current ion implantation apparatus are matched and shared. Moreover, a structure for switching the beamline configuration is constructed. In this manner, the implantation processing is possible over a broad range of energy and beam current regions on the same beamline (the same ion beam trajectory and the same implantation method).

The present invention has been described based on the embodiments. The present invention is not limited to the embodiments, and it can be understood by those skilled in the art that designs can be modified in various ways, various modifications can be made, and such modifications fall within the scope of the present invention.

In addition or alternative to the above-described configurations, the quantitative adjustment of the beam current by the beam current adjustment system can be configured in various ways. For example, when the beam current adjustment system includes a variable-width aperture arranged on the beamline, the variable-width aperture may be disposed at any arbitrary position. Therefore, the variable-width aperture may be disposed between the ion source and the mass analysis magnet, between the mass analysis magnet and the mass analysis slit, between the mass analysis slit and the beam shaping device, between the beam shaping device and the beam control device, between the beam control device and the beam conditioning device, between the respective elements of the beam conditioning device, and/or between the beam conditioning device and the workpiece. The variable-width aperture may be the mass analysis slit.

The beam current adjustment may be configured to adjust the amount of ion beam passing through the aperture by arranging the divergence/convergence lens system before and/or after a fixed-width aperture. The fixed-width aperture may be the mass analysis slit.

The beam current adjustment may be performed using an energy slit opening width variable (and/or a beamline end opening width variable slit apparatus). The beam current adjustment may be performed using an analyzer magnet (mass analysis magnet) and/or a steerer magnet (trajectory modification magnet). The dose amount adjustment may be accompanied by an expansion of the variable range of mechanical scan speed (for example, from ultra-low speed to ultra-high speed) and/or a change in the number of times of the mechanical scanning.

The beam current adjustment may be performed by the adjustment of the ion source (for example, amount of gas or arc current). The beam current adjustment may be performed by the exchange of the ion source. In this case, the ions source for MC and the ion source for HC may be selectively used. The beam current adjustment may be performed by the gap adjustment of the extraction electrode of the ion source. The beam current adjustment may be performed by providing the CVA immediately downstream of the ion source.

The beam current adjustment may be performed according to the change in the vertical width of the ribbon beam. The dose amount adjustment may be performed according to the change in the scanning speed during the two-dimensional mechanical scanning.

The beamline device may include a plurality of beamline components configured to operate under only one of the first beamline setting and the second beamline setting, and thus, the ion implantation apparatus may be configured as a high-current ion implantation apparatus or a medium-current ion implantation apparatus. That is, with the HCMC as a platform, for example, by exchanging some beamline components, or changing the power supply configuration, the serial-type high-dose dedicated ion implantation apparatus or the serial-type medium-dose dedicated ion implantation apparatus can be produced from the serial-type high-dose medium-dose wide-use ion implantation apparatus. Since it is expected to manufacture each dedicated apparatus at lower cost than the wide-use apparatus, it can contribute to reducing the manufacturing costs for the device maker.

In the MC, implantation at higher energy may be achieved by using multivalent ions such as divalent ions or trivalent ions. However, in the typical ion source (thermionic emission type ion source), the generation efficiency of multivalent ions is much lower than the generation efficiency of monovalent ions. Therefore, practical dose implantation in the high energy range is actually difficult. When a multivalent ion enhancement source, such as an RF ion source, is employed as the ion source, tetravalent or pentavalent ions can be obtained. Therefore, more ion beams can be obtained in the higher energy condition.

Therefore, by employing the multivalent ion enhancement source, such as the RF ion source, as the ion source, the HCMC can operate as the serial-type high energy ion implantation apparatus (HE). Therefore, a portion of the implantation condition that has been processed by only the serial-type high energy/low-dose ion implantation apparatus can be processed by the HCMC (the range of the MC illustrated in FIG. 8 may be expanded to include at least a portion of the range C).

Hereinafter, several aspects of the present invention will be described.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the beamline device supplies the ion beam having a beam irradiation region exceeding the width of the workpiece in the implantation processing chamber, the implantation processing chamber includes a mechanical scanning device for mechanically scanning the workpiece with respect to the beam irradiation region, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the ion implantation apparatus is configured to irradiate the workpiece with the ion beam in cooperation with mechanical scanning of the workpiece, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

The beamline device may take the same implantation method in the first implantation setting configuration and the second implantation setting configuration. The beam irradiation region may be equal in the first implantation setting configuration and the second implantation setting configuration.

The beamline apparatus may include a beam conditioning device for conditioning the ion beam, and a beam shaping device for shaping the ion beam. The beam conditioning device and the beam shaping device in the beamline device may be disposed in the same layout in the first implantation setting configuration and the second implantation setting configuration. The beam implantation apparatus may have the same installation floor area in the first implantation setting configuration and the second implantation setting configuration.

The beamline device may include a beam current adjustment system for adjusting the total amount of beam current of the ion beam. The first implantation setting configuration may include a first beam current setting for the beam current adjustment system, the second implantation setting configuration may include a second beam current setting for the beam current adjustment system, and the second beam current setting may be determined to make the beam current of the ion beam smaller than that of the first beam current setting.

The beam current adjustment system may be configured to block at least a portion of the ion beam when passing through an adjustment element. The beam current adjustment system may include a variable-width aperture arranged on the beamline. The beam current adjustment system may include a beamline end opening width variable slit device. The ion source may be configured to adjust the total amount of beam current of the ion beam. The ion source may include an extraction electrode for extracting the ion beam, and the total amount of beam current of the ion beam may be adjusted by adjusting an opening of the extraction electrode.

The beamline device may include an energy adjustment system for adjusting an implantation energy of the ions into the workpiece. The first implantation setting configuration may include a first energy setting for the energy adjustment system, the second implantation setting configuration may include a second energy setting for the energy adjustment system, the first energy setting may be suitable for transport of a lower energy beam as compared with the second energy setting.

The energy adjustment system may include a beam parallelizing device for parallelizing the ion beam. The beam parallelizing device may be configured to decelerate, or decelerate and accelerate the ion beam under the first implantation setting configuration, and accelerate, or accelerate and decelerate the ion beam under the second implantation setting configuration. The beam parallelizing device may include an acceleration lens for accelerating the ion beam, and a deceleration lens for decelerating the ion beam, and may be configured to modify a distribution of acceleration and deceleration, and the beam parallelizing device may be configured to mainly decelerate the ion beam under the first implantation setting configuration, and mainly accelerate the ion beam under the second implantation setting configuration.

The beamline device may include a beam current adjustment system for adjusting the total amount of beam current of the ion beam, and an energy adjustment system for adjusting an implantation energy of the ions into the workpiece, and may adjust the total amount of the beam current and the implantation energy individually or simultaneously. The beam current adjustment system and the energy adjustment system may be separate beamline components.

The ion implantation apparatus may include a control unit configured to manually or automatically select one implantation setting configuration suitable for a given ion implantation condition among the plurality of implantation setting configurations including the first implantation setting configuration and the second implantation setting configuration.

The control unit may select the first implantation setting configuration when a desired ion dose amount implanted into the workpiece is in the range of about $1\times10^{14}$ to $1\times10^{17}$ atoms/cm$^2$, and may select the second implantation setting configuration when a desired ion dose amount implanted into the workpiece is in the range of about $1\times10^{11}$ to $1\times10^{14}$ atoms/cm$^2$.

The beamline device may have a first energy adjustment range under the first implantation setting configuration, and may have a second energy adjustment range under the second implantation setting configuration, and the first energy adjustment range and the second energy adjustment range may have a partially overlapped range.

The beamline device may have a first dose adjustment range under the first implantation setting configuration, and may have a second dose adjustment range under the second implantation setting configuration, and the first dose adjustment range and the second dose adjustment range may have a partially overlapped range.

The beamline device may include a beam scanning device for providing scanning of the ion beam to form an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The beamline device may include a ribbon beam generator for generating a ribbon beam having an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The implantation processing chamber may include a workpiece holder configured to provide mechanical scanning of the workpiece in two directions perpendicular to each other in a plane perpendicular to the beam transportation direction.

The beamline device may be configured to be selectable from a plurality of beamline components configured to be operated under only one of the first implantation setting configuration and the second implantation setting configuration, and the ion implantation apparatus may be configured as a high-current dedicated ion implantation apparatus or a medium-current dedicated ion implantation apparatus.

An ion implantation method according to an embodiment includes: selecting one implantation setting configuration, with respect to a beamline device, which is suitable for a given ion implantation condition among a plurality of implantation setting configurations including a first implantation setting configuration suitable for transport of a low energy/high current beam for high-dose implantation into a workpiece, and a second implantation setting configuration suitable for transport of a high energy/low current beam for low-dose implantation into the workpiece; transporting an ion beam along a beam center trajectory being a reference in a beamline from an ion source to an implantation processing chamber by using the beamline device under the selected implantation setting configuration; and irradiating the workpiece with the ion beam in cooperation with mechanical scanning of the workpiece, wherein the beam center trajectory being the reference is equal in the first implantation setting configuration and the second implantation setting configuration.

The transporting may include adjusting an implantation dose amount into the workpiece by adjusting the total amount of beam current of the ion beam. The implantation dose amount may be adjusted in a first dose adjustment range under the first implantation setting configuration, and may be adjusted in a second dose adjustment range under the second implantation setting configuration, the second dose adjustment range including a dose range smaller than the first dose adjustment range.

The transporting may include adjusting the implantation energy into the workpiece. The implantation energy may be adjusted in a first energy adjustment range under the first implantation setting configuration, and may be adjusted in a second energy adjustment range under the second implantation setting configuration, the second energy adjustment range including an energy range higher than the first energy adjustment range.

1. An ion implantation apparatus according to an embodiment has the same beam trajectory and the same implantation method and has a broad energy range by switching a connection of a power supply for deceleration as a whole and a connection of a power supply for acceleration as a whole.

2. An ion implantation apparatus according to an embodiment has the same beam trajectory and the same implantation method and has a broad beam current range by including a device for cutting a portion of beam in a beamline upstream part in a beamline capable of obtaining a high current.

3. An ion implantation apparatus according to an embodiment may have the same beam trajectory and the same implantation method and have a broad energy range and a broad beam current range by including both of the features of the embodiment 1 and the embodiment 2.

An ion implantation apparatus according to an embodiment may be an apparatus that combines a beam scanning and a mechanical wafer scanning as the same implantation method in the embodiments 1 to 3. An ion implantation apparatus according to an embodiment may be an apparatus that combines a ribbon-shaped beam and a mechanical wafer scanning as the same implantation method in the embodiments 1 to 3. An ion implantation apparatus according to an embodiment may be an apparatus that combines a two-dimensional mechanical wafer scanning as the same implantation method in the embodiments 1 to 3.

4. An ion implantation apparatus according to an embodiment is configured to freely select/switch a high-dose high-current ion implantation and a medium-dose medium-current ion implantation by configuring a high-dose high-current ion implantation beamline component and a medium-dose medium-current ion implantation beamline component in parallel on the same beamline (the same ion beam trajectory and the same implantation method), and covers a very broad energy range from low energy to high energy and a very broad dose range from a low dose to a high dose.

5. In the embodiment 4, each beamline component shared in the high dose use and the medium dose use and each beamline component individually switched in the high dose/medium dose use may be configured on the same beamline.

6. In the embodiment 4 or 5, in order to adjust the beam current amount in a broad range, a beam limiting device (vertical or horizontal variable-width slit, or rectangular or circular variable opening) for physically cutting a portion of beam in a beamline upstream part may be provided.

7. In any one of the embodiments 4 to 6, a switch controller control device may be provided to select a high-dose high-current ion implantation and a medium-dose medium-current ion implantation, based on a desired ion dose amount implanted into the workpiece.

8. In the embodiment 7, the switch controller is configured to operate the beamline in a medium-dose acceleration (extraction)/acceleration (P lens)/acceleration or deceleration (AD column) mode when a desired ion dose amount implanted into the workpiece is in the medium-dose medium-current range of about $1 \times 10^{11}$ to $1 \times 10^{14}$ atoms/cm$^2$, and operate the beamline in a high-dose acceleration (extraction)/deceleration (P lens)/deceleration (AD column) mode when a desired ion dose amount implanted into the workpiece is in the high-dose high-current range of about $1 \times 10^{14}$ to $1 \times 10^{17}$ atoms/cm$^2$.

9. In any one of the embodiments 4 to 8, an apparatus for implanting ions of relatively high energy by using an acceleration mode and an apparatus for implanting ions of relatively low energy by using a deceleration mode may have a mutually overlapped energy range.

10. In any one of the embodiments 4 to 8, an apparatus for implanting ions of relatively high energy by using an acceleration mode and an apparatus for implanting ions of relatively low energy by using a deceleration mode may have a mutually overlapped dose range.

11. In any one of the embodiments 4 to 6, by limiting the beamline components, the ion implantation apparatus may easily be changed to a high-dose high-current dedicated ion implantation apparatus or a medium-dose medium-current dedicated ion implantation apparatus.

12. In any one of the embodiments 4 to 11, the beamline configuration may combine a beam scanning and a mechanical substrate scanning.

13. In any one of the embodiments 4 to 11, the beamline configuration may combine a mechanical substrate scanning and a ribbon-shaped beam having a width equal to or greater than a width of a substrate (or wafer or workpiece).

14. In any one of the embodiments 4 to 11, the beamline configuration may include a mechanical substrate scanning in a two-dimensional direction.

Figure 15A:
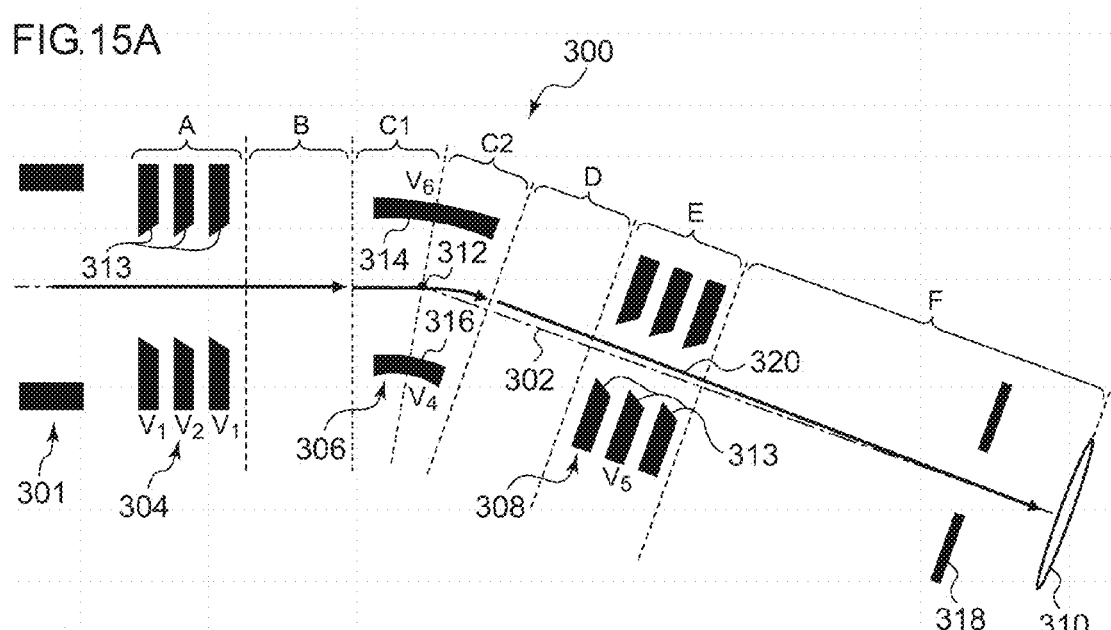
FIG. 15A illustrates a schematic configuration of a typical final energy filter.
Figure 15B:
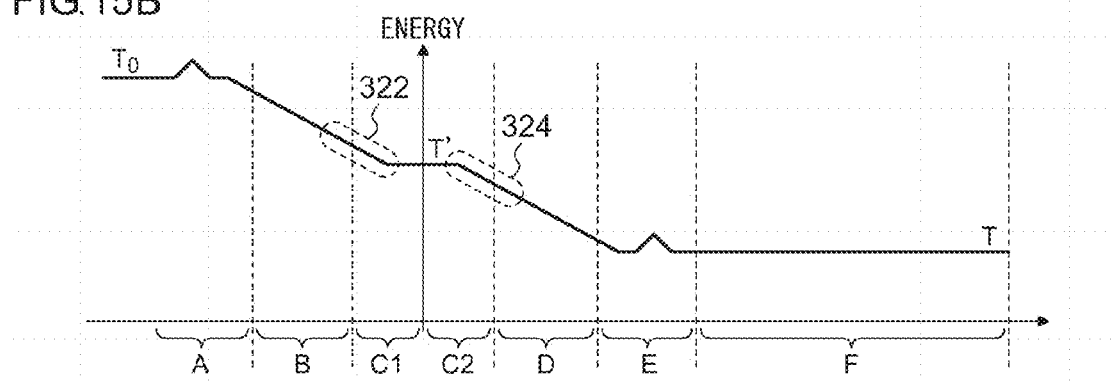
FIG. 15B illustrates an exemplary energy profile of ion beam along a beam trajectory when the final energy filter is operated in an offset mode.
Figure 15C:
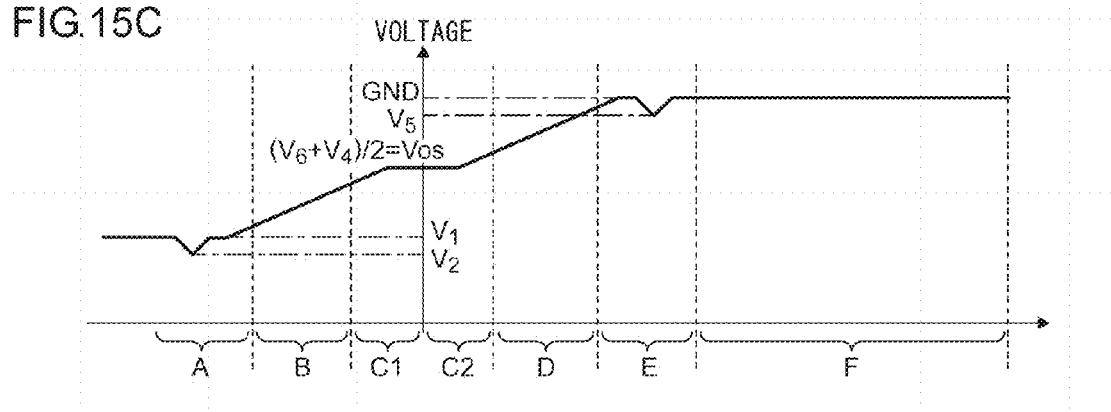
FIG. 15C illustrates exemplary voltages applied to respective components of the final energy filter when the final energy filter is operated in an offset mode.

FIG. 15A illustrates a schematic configuration of a typical final energy filter 300. FIG. 15B illustrates an exemplary energy profile of ion beam along a beam trajectory 302 when the final energy filter 300 is operated in the offset mode. FIG. 15C illustrates exemplary voltages applied to the respective components of the final energy filter 300 when the final energy filter 300 is operated in the offset mode.

The final energy filter 300 may be provided, for example, between the beamline device 104 and the implantation processing chamber 106 of the ion implantation apparatus 100 shown in FIG. 2 and may be arranged upstream of the workpiece W. Alternatively, the final energy filter 300 may be used as the energy filters 213 shown in FIG. 5A, FIG. 5B, FIG. 6 and FIG. 7 and may be arranged upstream of the wafer 214.

A beamline exit 301 is provided upstream of the final energy filter 300. Thus, the final energy filter 300 is arranged between a beamline exit 301 and a wafer 310. The beamline exit 301 is provided in the beamline device 104 and has an exit opening through which to pass an ion beam traveling from the beamline device 104 toward the final energy filter 300. The beamline exit 301 may be an exit of each of the terminals 216 shown in FIG. 5A, FIG. 5B, FIG. 6 and FIG. 7. The beamline exit 301 may be provided downstream of the AD column 212.

The final energy filter 300 is an electrostatic (electric-field type) energy filter. The final energy filter 300 includes an entrance-side einzel lens 304, a deflection electrode portion 306 and an exit-side einzel lens 308, in order from the upstream side of a beam trajectory 302. The entrance-side einzel lens 304 and the exit-side einzel lens 308 are each an exemplary adjustment electrode portion that adjusts the shape of the ion beam. Thus, the final energy filter 300 includes a first adjustment electrode portion on an upstream side and a second adjustment electrode portion on a downstream side.

For the purpose of illustration, the beam trajectory 302 from the final energy filter 300 to the wafer 310 is hereinafter divided into several sections or intervals. The entrance-side einzel lens 304 is placed in section A. Section B is a region between the entrance-side einzel lens 304 and the deflection electrode portion 306. The deflection electrode portion 306 is placed in section C. Thus, the section C may be called a deflection section. Of this deflection section, a region upstream of a deflection point 312 is called section C1, whereas a region downstream of the deflection point 312 is called section C2. The deflection point 312 is a point at the intersection of the designed beam trajectory 302 incident into the deflection electrode portion 306 and the designed beam trajectory 302 emitting therefrom. Section D is a region between the deflection electrode portion 306 and the exit-side einzel lens 308. The exit-side einzel lens 308 is placed in section E. Section F is a region between the exit-side einzel lens 308 and the wafer 310.

As explained in conjunction with FIG. 6, the final energy filter 300 can be operated in the offset mode. The offset mode is one of operation modes of the final energy filter 300. The offset mode is used to transport a relatively low energy ion beam (e.g., in a low energy range of about 0.1 to 100 keV), which is particularly a low energy and high-current ion beam. The space charge effect is strong in such an ion beam and therefore the ion beam is more likely to diverge during a transportation. In the offset mode, a negative offset voltage is applied to the deflection electrode portion 306, and the ion beam is deflected at an energy higher than an intended energy at which the ion beam is implanted to the wafer 310. In this manner, the ion beam can be efficiently transported while the divergence due to the space charge effect is suppressed.

Also, as described above, the final energy filter 300 can be operated in the normal mode, which differs from the offset mode. In the normal mode, the deflection electrode portion 306 deflects the ion beam having the intended energy. Accordingly, the ion beam entering the final energy filter 300 has already been adjusted to the intended energy. The normal mode can be used to transport a relatively high energy ion beam (e.g., in a high energy range of about 3 to 500 keV). The control unit 116 may switch the mode between the offset mode and the normal mode according to an intended energy. For example, the control unit 116 may select the offset mode if the intended energy is smaller than a predetermined threshold value; the control unit 116 may select the normal mode if the intended energy is larger than the predetermined value.

The energy threshold value for the switching depends on the design of beamline and is typically selected in a range of 10 keV to 60 keV.

The entrance-side einzel lens 304 and the exit-side einzel lens 308 shown in FIG. 15A are used to focus the ion beam. The entrance-side einzel lens 304 and the exit-side einzel lens 308 are each comprised of three electrodes that are arranged adjacent to each other along the beam trajectory 302. Each of these three electrodes is a polygonal (e.g., rectangular) or cylindrical hollow-shaped electrode having an aperture through which to have the ion beam passed.

An edge portion 313 is formed in each electrode of the entrance-side einzel lens 304, and an edge portion 313 is formed in each electrode of the exit-side einzel lens 308. Each of the edge portions 313 has an inclined surface such that the inclined surface is located away from the beam trajectory 302 as the ion beam travels from the entrance of an electrode toward the exit thereof. The inclined surface is formed on an inner surface of the electrode facing the beam trajectory 302; if the electrode has a hollow shape, the inclined surface will be formed on an inner peripheral surface thereof. A detailed description is given later of the edge portions 313. Note that the edge portion 313 described above may be provided in at least one electrode of the entrance-side einzel lens 304 and/or the exit-side einzel lens 308.

As shown in FIGS. 15A and 15C, a voltage $V_2$ is applied to the middle electrode of the entrance-side einzel lens 304, and a voltage $V_1$ is applied to electrodes at the both ends thereof. Also, a voltage $V_5$ is applied to the middle electrode of the exit-side einzel lens 308, and the electrodes at the both ends thereof are connected with ground potential. In each of the entrance-side einzel lens 304 and the exit-side einzel lens 308, the middle electrode has a negative potential relative to the electrodes at the both ends thereof ($V_2 < V_1 \leq 0$, $V_5 < 0$). In addition to the beam shape adjustment, the entrance-side einzel lens 304 and the exit-side einzel lens 308 can suppress the inflow of electrons into the final energy filter 300.

The final energy filter 300 may include an entrance-side suppression electrode, as the first adjustment electrode portion, in substitution for the entrance-side einzel lens 304. Also, the final energy filter 300 may include an exit-side suppression electrode, as the second adjustment electrode portion, in substitution for the exit-side einzel lens 308. The entrance-side suppression electrode and the exit-side suppression electrode are provided for the purpose of suppressing the inflow of electrons into the final energy filter 300.

In a modification, the suppression electrodes may be realized by adjustment electrode portions having the same electrode structure as the einzel lens. This modification differs from the aforementioned present embodiment in the electric potential difference given to the middle electrode thereof relative to the electrodes at both ends thereof. More specifically, if this potential difference is of a negative value and the absolute value thereof is relatively large (e.g., about −30 kV), the beam focusing effect will be exerted on the ion beam by the adjustment electrode portions and therefore the adjustment electrode portions will function as the einzel lens. If, on the other hand, the potential difference is of a negative value and the absolute value thereof is relatively small (e.g., about −2 kV to about −5 kV), the adjustment electrode portions will function as a barrier against electrons (electron suppression). If the adjustment electrode portions are used as the suppression electrodes, the space charge effect will be regulated by restricting the behavior of electrons surrounding the ion beam. As a result, the adjustment electrode portions can indirectly adjust the beam shape of the ion beam to a certain degree.

The deflection electrode portion 306 includes a first deflection electrode 314 and a second deflection electrode 316. The first deflection electrode 314 is arranged on one side of the ion beam. The second deflection electrode 316, which is disposed opposite to the first deflection electrode 314, is arranged on the other side of the ion beam. A voltage $V_6$ is applied to the first deflection electrode 314, and a voltage $V_4$, which is different from the voltage $V_6$, is applied to the second deflection electrode 316. The deflection electrode portion 306 deflects the ion beam by the electric potential difference occurring between the first deflection electrode 314 and the second deflection electrode 316. The aforementioned offset voltage $V_{OS}$ in the offset mode is an average voltage of the first deflection electrode 314 and the second deflection electrode 316 (i.e., $V_{OS} = (V_6 + V_4)/2$).

Also, a slit 318, which is used to restrict the beam size, or as an energy slit, which is used to eliminate a different energy component, is arranged upstream of the wafer 310 in the section F. The opening width of the slit 318 may be varied by control of an actuator.

Thus, as shown in FIG. 15C, the electric potential increases starting from the voltage $V_1$ at the exit of the section A toward the voltage $V_{OS}$ at the entrance of the section C along the beam trajectory 302. Further, the electric potential increases starting from voltage $V_{OS}$ at the exit of the section C toward the ground potential at the entrance of the section E along the beam trajectory 302.

Thus, as shown in FIG. 15B, the energy of ion beam decreases starting from an energy $T_0$ at the exit of the section A toward an energy T' at the entrance of the section C along the beam trajectory 302. Further, the energy decreases starting from the energy T' at the exit of the section C toward an energy T at the entrance of the section E along the beam trajectory 302.

As described above, in the offset mode, the ion beam entering the final energy filter 300 has the high energy $T_0$. The final energy filter 300 decelerates the ion beam down to the intended energy T and directs the ion beam to the wafer 310. The ion beam is deflected at the energy T' that is intermediate between the energy $T_0$ and the energy T. In this manner, the wafer 310 is irradiated with the ion beam having the intended energy T.

The actual locus or tracks of the ion beam is exemplified by arrows 320 in FIG. 15A. As illustrated in FIG. 15A, through the observations and study done by the inventor there is a possibility that the actual tracks can deviate from the designed beam trajectory 302. This is because the energy of the ion beam differs between at the entrance and at the exit of the deflection electrode portion 306. As illustrated by broken lines 322 and 324 in FIG. 15B, the energy of the ion beam is higher, near the entrance of the deflection electrode portion 306, than the energy T' and is lower, near the exit thereof, than the energy T'. Thus, the energy range of the ion beam in an entrance region of the deflection electrode portion 306 does not overlap with the energy range thereof in an exit region thereof.

The higher the energy is, the less the deflection amount of the beam is. Thus, the deflection amount is smaller near the entrance of the deflection electrode portion 306, and the deflection amount is larger near the exit thereof. Thus, the actual deflection point of the ion beam is shifted toward an exit side compared with the designed deflection point 312. As a result, the incident angle of the ion beam to the wafer 310 deviates from the intended angle.

Figure 16:
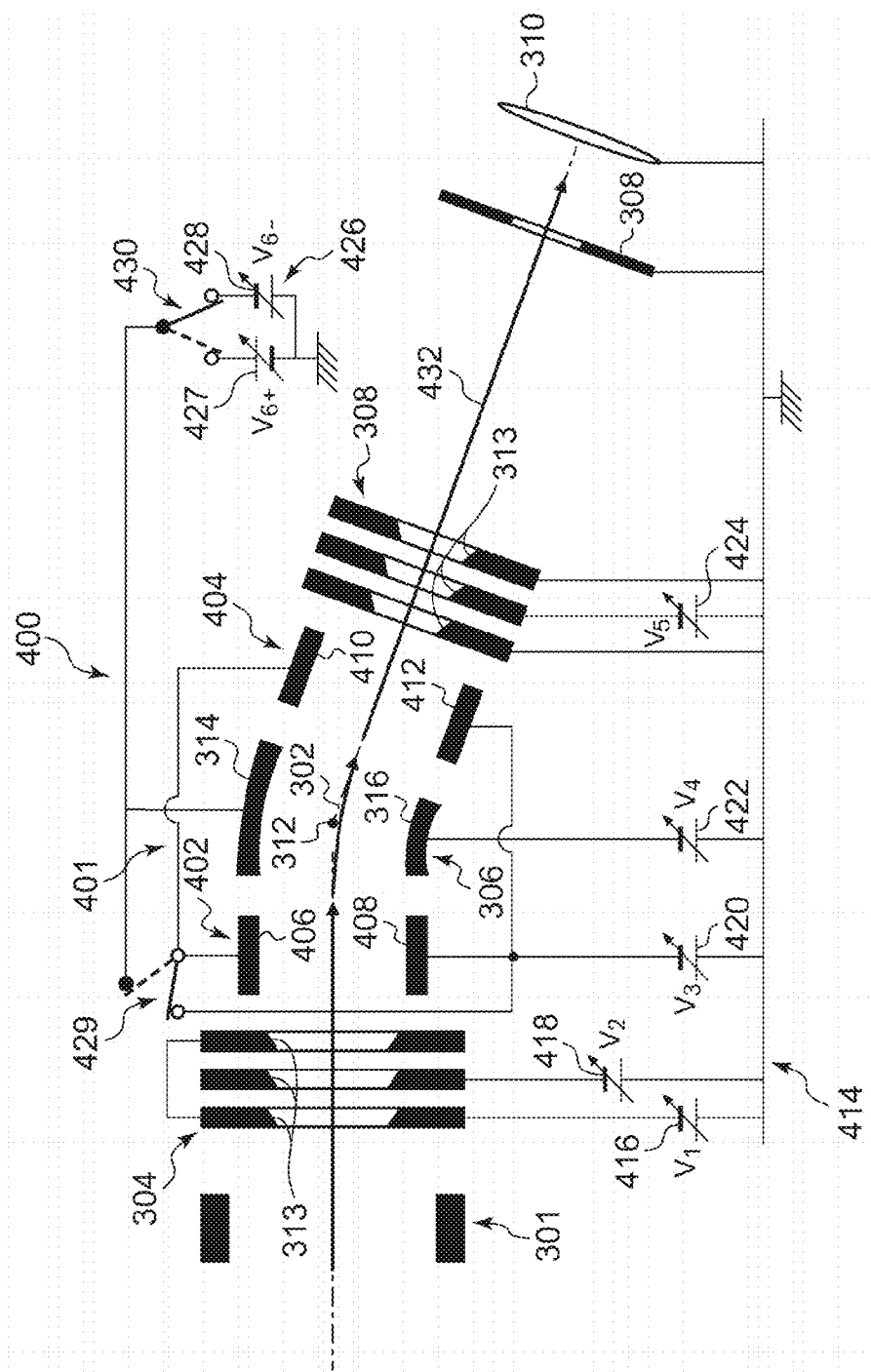
FIG. 16 illustrates a schematic configuration of a final energy filter according to an embodiment of the present invention.

FIG. 16 illustrates a schematic configuration of a final energy filter 400 according to an embodiment of the present invention. FIG. 17A schematically illustrates an electrode arrangement of the final energy filter 400 shown in FIG. 16. FIG. 17B illustrates an exemplary energy profile of ion beam along the beam trajectory 302 when the final energy filter 400 is operated in the offset mode. FIG. 17C illustrates exemplary voltages applied to the respective components of the final energy filter 400 when the final energy filter 400 is operated in the offset mode. The final energy filter may be referred to as "FEF" hereinbelow.

The final energy filter 400 shown in FIG. 16 has the same configuration as that of the final energy filter 300 shown in FIG. 15 except that the final energy filter 400 includes an upstream auxiliary electrode portion 402 and a downstream auxiliary electrode portion 404. Thus, the above explanation on the final energy filter 300 approximately applies to the final energy filter 400.

As shown in FIG. 16 and FIG. 17A, the final energy filter 400 includes an intermediate electrode portion 401 that deflects the ion beam. The intermediate electrode portion 401 includes the upstream auxiliary electrode portion 402, the deflection electrode portion 306, and the downstream auxiliary electrode portion 404. The upstream auxiliary electrode portion 402 is arranged upstream of the deflection electrode portion 306, and the downstream auxiliary electrode portion 404 is arranged downstream of the deflection electrode portion 306. The upstream auxiliary electrode portion 402 is located in the section B and therefore the upstream auxiliary electrode portion 402 is positioned between the entrance-side einzel lens 304 and the deflection electrode portion 306. The downstream auxiliary electrode portion 404 is located in the section D and therefore the downstream auxiliary electrode portion 404 is positioned between the deflection electrode portion 306 and the exit-side einzel lens 308.

The upstream auxiliary electrode portion 402 includes a first upstream auxiliary electrode 406 and a second upstream auxiliary electrode 408. The first upstream auxiliary electrode 406 is arranged on one side of the ion beam. The second upstream auxiliary electrode 408, which is disposed opposite to the first upstream auxiliary electrode 406, is arranged on the other side of the ion beam. The downstream auxiliary electrode portion 404 includes a first downstream auxiliary electrode 410 and a second downstream auxiliary electrode 412. The first downstream auxiliary electrode 410 is arranged on one side of the ion beam. The second downstream auxiliary electrode 412, which is disposed opposite to the first downstream auxiliary electrode 410, is arranged on the other side of the ion beam.

As described above, the final energy filter 400 includes a first electrode group, which consists of the first upstream auxiliary electrode 406, the first deflection electrode 314 and the first downstream auxiliary electrode 410, and a second electrode group, which consists of the second upstream auxiliary electrode 408, the second deflection electrode 316 and the second downstream auxiliary electrode 412. The first electrode group is located above the beam trajectory 302, and the second electrode group is located below the beam trajectory 302.

The intermediate electrode portion 401 is configured to be symmetrical with respect to a plane. The plane of symmetry is a plane including the deflection point 312 and vertical to the deflected beam trajectory in the deflection electrode portion 306. As described above, the deflection point 312 is the intersection point of an incident beam trajectory entering the deflection electrode portion 306 and an emission beam trajectory emitting therefrom. Since the deflected beam trajectory draws an arc of a circle, the symmetry plane of the intermediate electrode portion 401 passes through the center of the circle and the deflection point 312. With this configuration as described above, the electric field distribution in the intermediate electrode portion 401 can be formed symmetrically when the identical electric potential is given to each of the upstream auxiliary electrode portion 402 and the downstream auxiliary electrode portion 404.

As shown in FIG. 17A, for the purpose of illustration, hereinafter a region between the upstream auxiliary electrode portion 402 and the deflection electrode portion 306 is called a first region G1, and a region between the deflection electrode portion 306 and the downstream auxiliary electrode portion 404 is called a second region G2.

As shown in FIG. 16, the final energy filter 400 includes an FEF (final energy filter) power supply unit 414. The FEF power supply unit 414 is so configured as to apply voltages separately to the first adjustment electrode portion, the intermediate electrode portion 401 and the second adjustment electrode portion, respectively, in the following manners. That is, FEF power supply unit 414 applies the voltages thereto such that one of the deceleration of the ion beam, the acceleration of the ion beam and the iso-energetic transportation of the ion beam is carried out between the first adjustment electrode portion and the intermediate electrode portion 401, and such that one of the deceleration, the acceleration and the iso-energetic transportation thereof is carried out between the intermediate electrode portion 401 and the second adjustment electrode portion. For example, the ion beam is decelerated, accelerated or iso-energetically transported between the entrance-side einzel lens 304 and the upstream auxiliary electrode portion 402. Also, the ion beam is decelerated, accelerated or iso-energetically transported between the downstream auxiliary electrode portion 404 and the exit-side einzel lens 308. Here, the iso-energetic transportation of the ion beam means that the ion beam is transported as it is while the energy of the ion beam is being kept unchanged without the ion beam being accelerated nor decelerated.

Though the detailed description is given later, the FEF power supply unit 414 applies voltages to the upstream auxiliary electrode portion 402, the deflection electrode portion 306 and the downstream auxiliary electrode portion 404, respectively, such that, at least in the offset mode, an energy range of the ion beam in the first region G1 is approximately equal to an energy range of the ion beam in the second region G2.

Here, the above expression "an energy range of the ion beam in the first region G1 being approximately equal to an energy range of the ion beam in the second region G2" means that, for example, there is an overlap between a first energy range in the first region G1 and a second energy range in the second region G2. For example, the first energy range and the second energy range may have a common upper limit. Alternatively, the first energy range and the second energy range may have a common lower limit. This common upper limit or lower limit is the aforementioned energy T'. Preferably, the first energy range in the first region G1 may be practically identical to the second energy range in the second region G2. Also, the energy range may have no dispersion; in such a case, the energy may be a constant value both in the first region G1 and the second region G2.

If the incident angle and/or the incident position of the ion beam to the workpiece deviate(s) from a designed value but the difference (deviation) therefrom is within an allowable range, this may be considered that the energy range is "approximately equal" to each other between in the first region G1 and in the second region G2. Or if the positional deviation of the deflection point 312 is in an allowable range, this may be also considered that the energy range is "approximately equal" to each other between in the first region G1 and in the second region G2.

The FEF power supply unit 414 includes a first FEF power supply 416, a second FEF power supply 418, a third FEF power supply 420, a fourth FEF power supply 422, a fifth FEF power supply 424, and a sixth FEF power supply 426. Each of the first to sixth power supplies 416 to 426 in the FEF power supply unit 414 is a variable direct-current (DC) power supply and is provided between each of their corresponding electrodes and the ground potential. The sixth FEF power supply 426 has a sixth positive power supply 427 and a sixth negative power supply 428, which are provided being switchable each other.

Also, the FEF power supply unit 414 includes a first FEF switch 429 and a second FEF switch 430. The first FEF switch 429 is so provided that the first upstream auxiliary electrode 406 and the first downstream auxiliary electrode 410 are connected to either the third FEF power supply 420 or the sixth FEF power supply 426. The second FEF switch 430 is so provided that the first deflection electrode 314 is connected to either the sixth positive power supply 427 or the sixth negative power supply 428.

In FIG. 16, the connection states of the first FEF switch 429 and the second FEF switch 430 in the offset mode are indicated by solid lines, and the connection states thereof in the normal mode are indicated by broken lines. As illustrated in FIG. 16, in the offset mode, the first FEF switch 429 connects both the first upstream auxiliary electrode 406 and the first downstream auxiliary electrode 410 to the third FEF power supply 420. In the normal mode, the first FEF switch 429 connects both the first upstream auxiliary electrode 406 and the first downstream auxiliary electrode 410 to the sixth FEF power supply 426. In the offset mode, the second FEF switch 430 generally connects the first deflection electrode 314 to the sixth negative power supply 428. In the normal mode, the second FEF switch 430 connects the first deflection electrode 314 to the sixth positive power supply 427. Thus, in the normal mode, both the first upstream auxiliary electrode 406 and the first downstream auxiliary electrode 410 are connected to the sixth positive power supply 427.

The first FEF power supply 416 and the second FEF power supply 418 are provided for use in the entrance-side einzel lens 304. A voltage $V_2$ is applied to the middle electrode of the entrance-side einzel lens 304 from the second FEF power supply 418, and a voltage $V_1$ is applied to electrodes at the both ends thereof from the first FEF power supply 416.

In the offset mode, the third FEF power supply 420 applies an auxiliary voltage $V_3$ to the upstream auxiliary electrode portion 402 and the downstream auxiliary electrode portion 404. In other words, the auxiliary voltage $V_3$ is applied to the first upstream auxiliary electrode 406, the second upstream auxiliary electrode 408, the first downstream auxiliary electrode 410, and the second downstream auxiliary electrode 412. Thus, in the offset mode, an upstream auxiliary voltage applied to the upstream auxiliary electrode portion 402 is equal to a downstream auxiliary voltage applied to the downstream auxiliary electrode portion 404.

Since the same auxiliary voltage $V_3$ is applied both to the first upstream auxiliary electrode 406 and to the second upstream auxiliary electrode 408, the ion beam travels in a straight line when passing through the upstream auxiliary electrode portion 402. In other words, in the offset mode, the upstream auxiliary electrode portion 402 is not the deflection electrodes. Similarly, in the offset mode, the downstream auxiliary electrode portion 404 is not the deflection electrodes.

In an embodiment shown in FIG. 17C, the auxiliary voltage $V_3$ is equal to the offset voltage $V_{OS}$. In other words, the FEF power supply unit 414 applies voltages to the first deflection electrode 314 and the second deflection electrode 316, respectively, such that, in the offset mode, an average voltage of the first deflection electrode 314 and the second deflection electrode 316 is equal to the upstream auxiliary voltage and the downstream auxiliary voltage.

The fourth FEF power supply 422 applies a voltage $V_4$ to the second deflection electrode 316, and the fifth FEF power supply 424 applies a voltage $V_5$ to the middle electrode of the exit-side einzel lens 308.

In the offset mode, the sixth FEF power supply 426 generally applies a voltage $V_{6-}$ to the first deflection electrode 314 from the sixth negative power supply 428. However, in the offset mode, a voltage $V_{6+}$ may possibly be applied to the first deflection electrode 314 from the sixth positive power supply 427. In such a case, the second FEF switch 430 connects the first deflection electrode 314 to the sixth positive power supply 427.

In the offset mode, the voltage $V_6$ applied to the first deflection electrode 314 is determined by the following equation.

$$V_6 = K^* T'/q + V_{OS} = K^*(T/q + k_1^* V_{OS} + k_2^* V_3) + V_{OS}$$

Here, q is an ionic valence and K is a positive constant concerning the beam deflection determined by the structure of the deflection electrode portion 306. $k_1$ and $k_2$ are each a negative constant concerning the energy determined by the structures of the deflection electrode portion 306, the upstream auxiliary electrode portion 402 and the downstream auxiliary electrode portion 404. If the voltage determined by the above equation is positive, the sixth positive power supply 427 will be used; if the voltage determined thereby is negative, the sixth negative power supply 428 will be used. Similarly, the voltage $V_4$ applied to the second deflection electrode 316 in the offset mode is determined by the following equation. The voltage $V_4$ is negative.

$$V_4 = -K^* T'/q + V_{OS} = -K^*(T/q + k_1^* V_{OS} + k_2^* V_3) + V_{OS}$$

As described above, applying the voltages to the final energy filter 400 from the FEF power supply unit 414 allows the electric potential to increase from the voltage $V_1$ at the exit of the section A to the voltage $V_3$ at the entrance of the section B along the beam trajectory 302, as shown in FIG. 17C. The voltage $V_3$ stays constant between the section B and the section D along the beam trajectory 302. The electric potential increases from the voltage $V_3$ at the exit of the section D to the ground potential at the entrance of the section E along the beam trajectory 302.

Accordingly, as shown in FIG. 17B, the energy of the ion beam decreases from the energy $T_0$ at the exit of the section A to the energy T' at the entrance of the section B along the beam trajectory 302. Further, the energy of the ion beam decreases from the energy T' at the exit of the section D to the energy T at the entrance of the section E along the beam trajectory 302. In other words, the ion beam is decelerated between the entrance-side einzel lens 304 and the upstream auxiliary electrode portion 402 and is further decelerated between the downstream auxiliary electrode portion 404 and the exit-side einzel lens 308.

Here, the energy of the ion beam is constant at the energy T' between the section B and the section D along the beam trajectory 302. In other words, the ion beam is iso-energetically transported in the intermediate electrode portion 401. In particular, as indicated by broken lines 434 and 436 in FIG. 17B, the energy is equal to each other in both the first region G1 and the second region G2 at the energy T'.

The actual locus or tracks of the ion beam for this case is exemplified by arrows 432 in FIG. 16 and FIG. 17A. As illustrated in the broken lines 434 and 436 in FIG. 17B, the energy of the ion beam is constant between near the entrance of the deflection electrode portion 306 and near the exit thereof. Thus, there is no difference in energy between the first region G1 and the second region G2, and the ion beam is curved at the designed deflection point 312. Different from and in contrast to the case shown in FIG. 15A and FIG. 15B, this allows the ion beam to be transported along the designed beam trajectory 302 and allows the ion beam to enter the wafer 310 at the intended incident angle.

On the other hand, in the normal mode, the third FEF power supply 420 applies the voltage $V_3$ to the second upstream auxiliary electrode 408 and the second downstream auxiliary electrode 412. At this time, the fourth FEF power supply 422 is so regulated as to apply the same voltage $V_3$ to the second deflection electrode 316. In this manner, the voltage $V_3$ is applied in common to each electrode of the second electrode group. The sixth positive power supply 427 applies the voltage $V_{6+}$ to the first upstream auxiliary electrode 406, the first deflection electrode 314 and the first downstream auxiliary electrode 410. In the normal mode, the offset voltage $V_{OS}$ is zero (i.e., $V_3=-V_{6+}$). In the normal mode, the ion beam is iso-energetically transported between the entrance-side einzel lens 304 and the exit-side einzel lens 308 along the beam trajectory 302.

Thus, in the normal mode, there occurs an electric potential difference ($V_{6+}-V_3$) between the first electrode group and the second electrode group. This electric potential difference causes the ion beam to be deflected. Thus, in the normal mode, not only the deflection electrode portion 306 but also the upstream auxiliary electrode portion 402 and the downstream auxiliary electrode portion 404 are used as the deflection electrodes. This configuration is useful for deflecting a high energy ion beam. It is to be noted here that only one of the upstream auxiliary electrode portion 402 and the downstream auxiliary electrode portion 404 may be used as the deflection electrode.

Figure 18A:
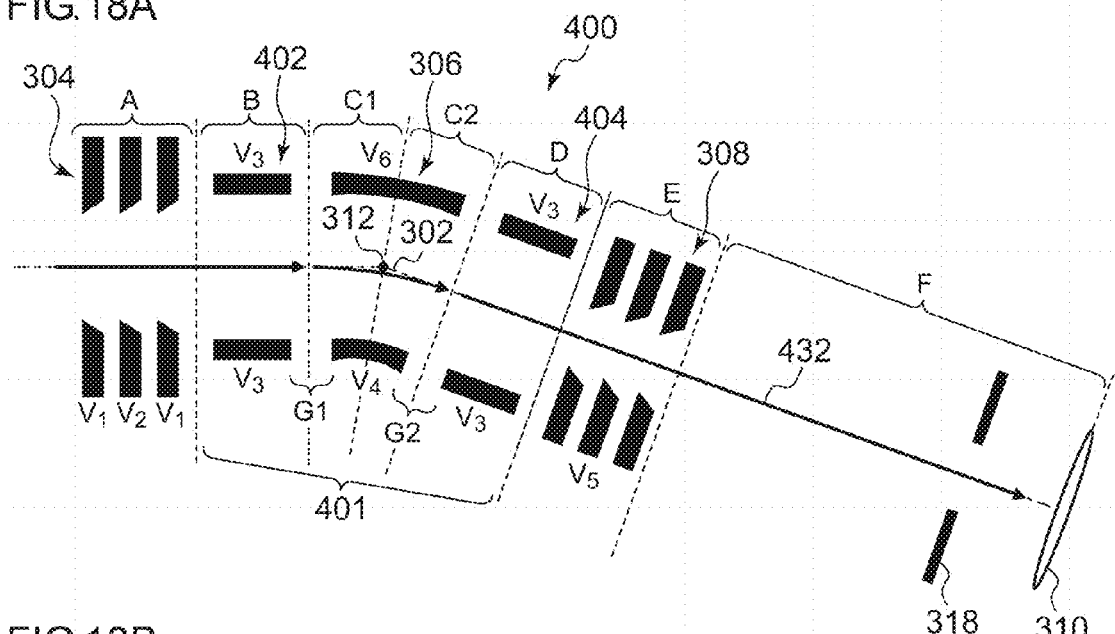
FIG. 18A schematically illustrates an electrode arrangement of the final energy filter shown in FIG. 16.
Figure 18B:
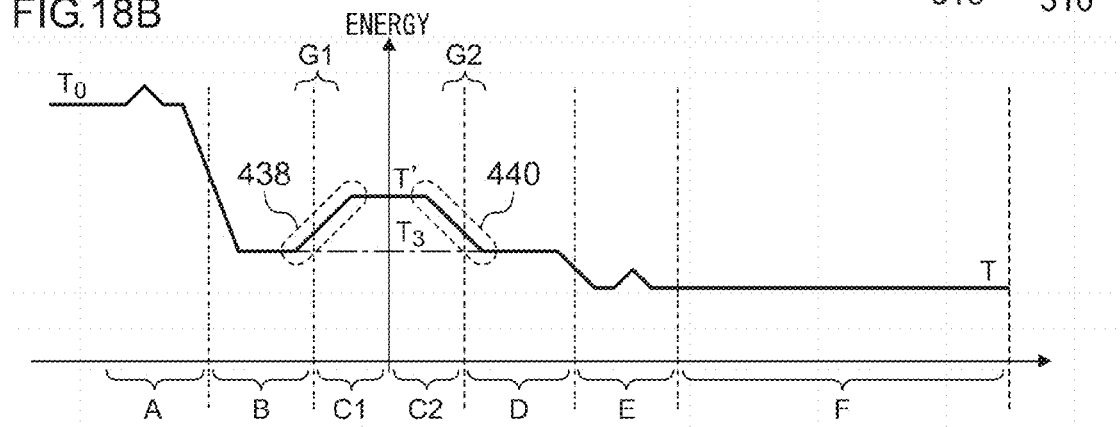
FIG. 18B illustrates an exemplary energy profile of ion beam along a beam trajectory when the final energy filter is operated in an offset mode.
Figure 18C:
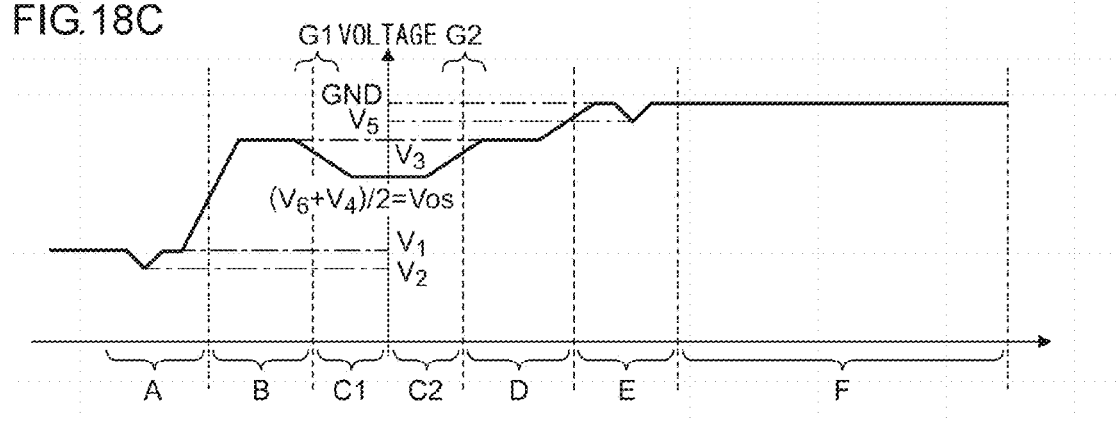
FIG. 18C illustrates exemplary voltages applied to the respective components of the final energy filter when the final energy filter is operated in an offset mode.

FIG. 18A schematically illustrates an electrode arrangement of the final energy filter 400 shown in FIG. 16. FIG. 18B illustrates an exemplary energy profile of ion beam along the beam trajectory 302 when the final energy filter 400 is operated in the offset mode. FIG. 18C illustrates exemplary voltages applied to the respective energy components of the final energy filter 400 when the final energy filter 400 is operated in the offset mode. FIG. 18A is identical to FIG. 17A.

In this embodiment, the auxiliary voltage $V_3$ differs from the offset voltage $V_{OS}$. In other words, the FEF power supply unit 414 applies voltages to the first deflection electrode 314 and the second deflection electrode 316 such that, in the offset mode, the average voltage of the first deflection electrode 314 and the second deflection electrode 316 differs from the upstream auxiliary voltage as well as the downstream voltage. The auxiliary voltage $V_3$ may be larger than the offset voltage $V_{OS}$, for example, as shown in FIG. 18C. In this case, the auxiliary voltage $V_3$ should be still negative.

In this case, as shown in FIG. 18B, the energy of the ion beam decreases from the energy $T_0$ at the exit of the section A to an energy $T_3$ at the entrance of the section B along the beam trajectory 302. The energy $T_3$ is an energy value corresponding to the auxiliary voltage $V_3$. In this manner, the ion beam is decelerated between the entrance-side einzel lens 304 and the upstream auxiliary electrode portion 402.

The energy of the ion beam increases from the energy $T_3$ at the exit of the section B to the energy T' at the entrance of the section C, and then again decreases from the energy T' at the exit of the section C to the energy $T_3$ at the entrance of the section D. In other words, the ion beam is accelerated between the upstream auxiliary electrode portion 402 and the deflection electrode portion 306 and is decelerated between the deflection electrode portion 306 and the downstream auxiliary electrode portion 404.

Further, the energy of the ion beam decreases from the energy $T_3$ at the exit of the section D to the energy T at the entrance of the section E along the beam trajectory 302. The ion beam is decelerated between the downstream auxiliary electrode portion 404 and the exit-side einzel lens 308.

In this manner, the first energy range in the first region G1 and the second energy range in the second region G2 match with each other. Each of the first energy range and the second energy range lies in the range from the energy $T_3$ to the energy T'. Note, however, that the energy profiles of ion beams in the first region G1 and the second region G2 are symmetrical with each other.

Since the energy at the first region G1 is equal in level to the energy at the second region G2 and vice versa, the ion beam is bent at the designed deflection point 312. As a result, the ion beam can be transported along the designed beam trajectory 302 and can enter the wafer 310 at the intended incident angle.

In a modification, the auxiliary voltage $V_3$ may be smaller than the offset voltage $V_{OS}$. In this modification, the ion beam is decelerated between the upstream auxiliary electrode portion 402 and the deflection electrode portion 306, and is accelerated between the deflection electrode portion 306 and the downstream auxiliary electrode portion 404. In this modification, the first energy range and the second energy range can also be approximately equal to each other.

Figure 19:
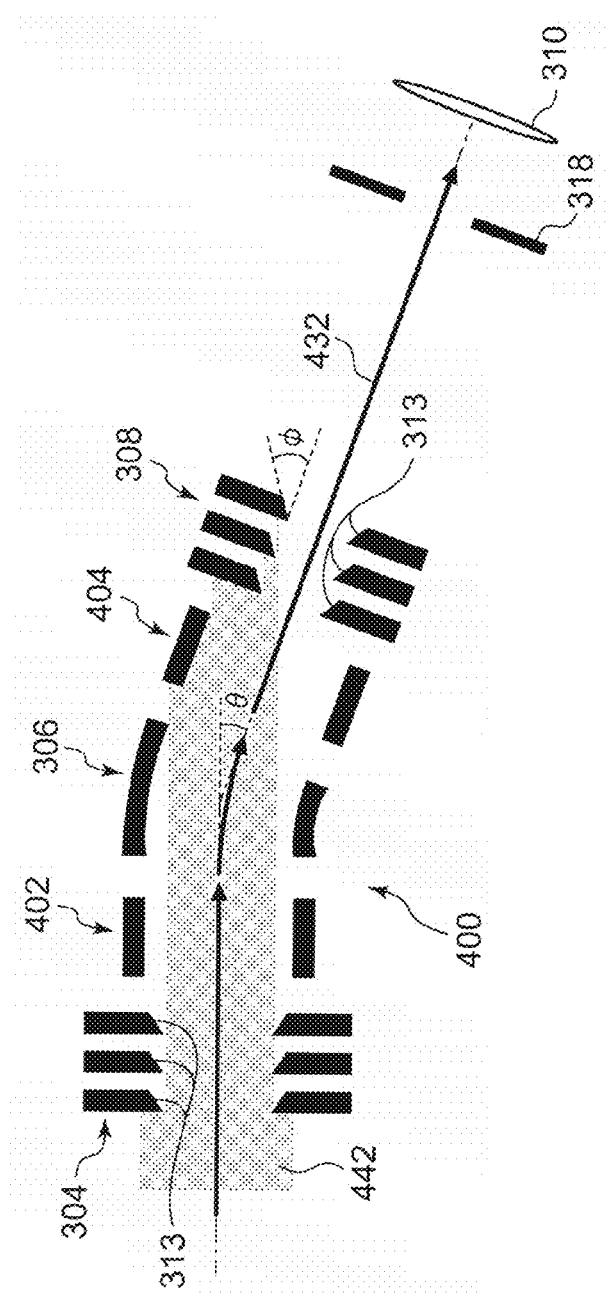
FIG. 19 illustrates a schematic configuration of a final energy filter according to an embodiment of the present invention.

There is a possibility that a neutral beam enters the final energy filter 400 from the upstream side thereof. The neutral beam is a beam neutralized with an energy, which differs from the intended energy, in a position upstream of the final energy filter 400. A region 442 where such a neutral beam may possibly pass through is shown in FIG. 19. The neutral beam like this is contaminating dopants and is not desired to be implanted into the wafer 310. If such a neutral beam collides with the final energy filter 400 or other structural objects, it may possibly be scattered in a direction different from its incident direction. The scattered neutral beam may possibly be directed toward the wafer 310. Hence, it is desirable that the surface area of such a structural object which the neutral beam may possibly hit be as small as possible.

In the present embodiment, as described above, each electrode of the entrance-side einzel lens 304 includes the edge portion 313, and each electrode of the exit-side einzel lens 308 includes the edge portion 313. Each edge portion 313 has the inclined surface such that the inclined surface is located away from the beam trajectory 302 as the ion beam travels from the entrance of an electrode toward the exit thereof. Assume, as illustrated in FIG. 19, that an inclination angle φ of the inclined surface on the exit-side einzel lens 308 is defined to be an angle of the inclined surface relative to the traveling direction of the ion beam. Then, the inclination angle φ is preferably larger than a deflection angle θ at the deflection electrode portion 306. With this configuration, the inclined surfaces of the edge portions 313 of the exit-side einzel lens 308 are placed outside the region 442 where the neutral beam may possibly pass through, so that the neutral beam does not hit the inner surfaces of the electrodes. Thus, the edge portions 313 can reduce the surface area of the structural object, which the neutral beam may possibly collide with, in the final energy filter 400. In this manner, the implantation amount of the neutral beam, having an energy different from the intended energy, into the wafer 310 can be reduced. Hence, the edge portions 313 of the exit-side einzel lens 308 are effective as one of countermeasures to prevent energy contamination. Note that the entrance-side einzel lens 304 may not have the edge portions 313.

Figure 20:
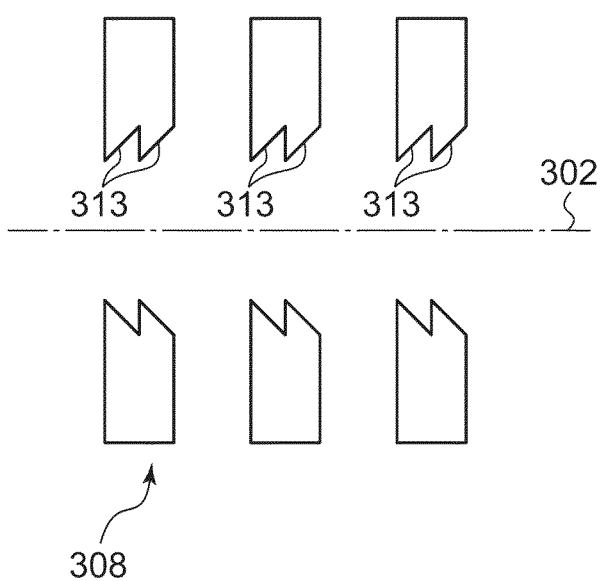
FIG. 20 schematically illustrates electrodes of a final energy filter according to an embodiment of the present invention.

As shown in FIG. 20, a plurality (e.g., two) of edge portions 313 may be formed on the inner surface of each electrode of the exit-side einzel lens 308. Each of the plurality of edge portions 313 has an inclined surface such that the inclined surface is located away from the beam trajectory 302 as the ion beam travels from the entrance of an electrode toward the exit thereof. This embodiment is suitable for a case where the electrode is relatively thick along the direction of the beam trajectory 302. The exit-side einzel lens 308 is exemplified in FIG. 20. Similarly, a plurality of edge portions 313 may be provided in the entrance-side einzel lens 304.

Figure 21:
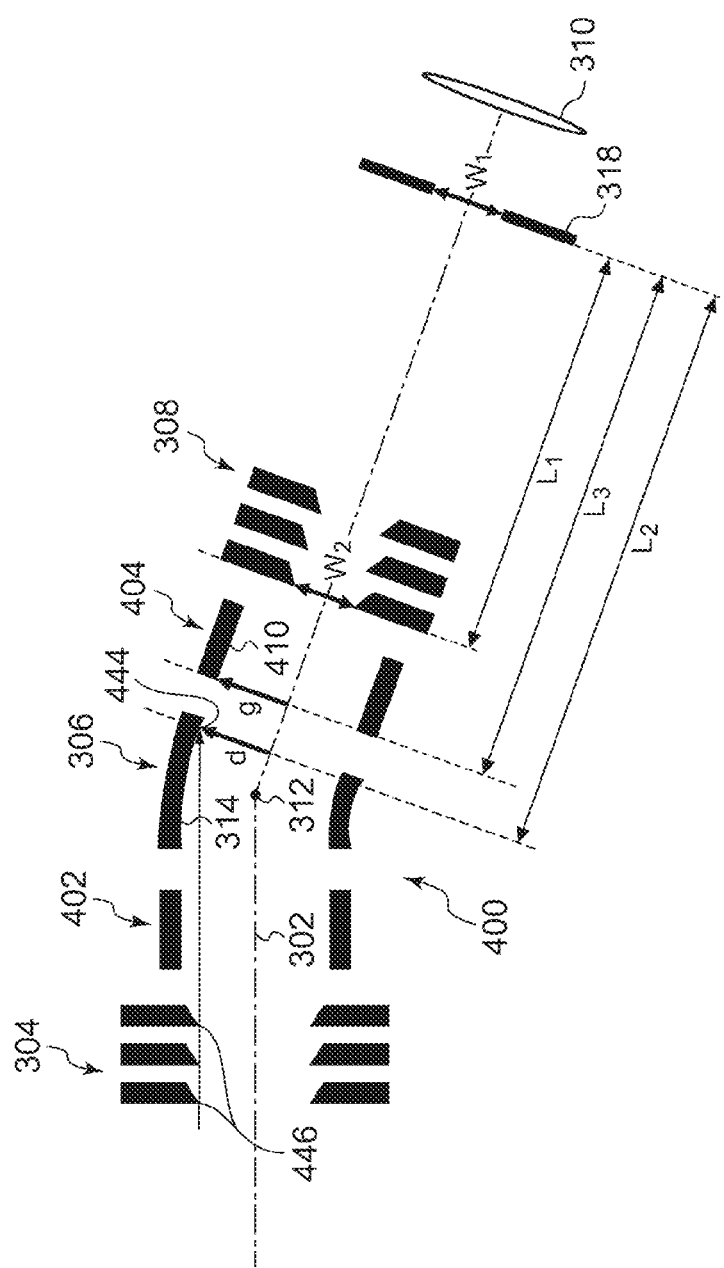
FIG. 21 illustrates a schematic configuration of a final energy filter according to an embodiment of the present invention.

Considering a path through which the neutral beam flows out of the final energy filter 400 into the wafer 310 is also effective as one of countermeasures to prevent the energy contamination. For this purpose, as shown in FIG. 21, the final energy filter 400 may have at least one opening, arranged between the downstream auxiliary electrode portion 404 and the wafer 310, such that at least part of a surface of the deflection electrode portion 306 is invisible from the wafer 310. A neutral beam collision point 444 in the deflection electrode portion 306 is hidden from the wafer 310, so the arrival of the scattered neutral beam from the deflection electrode portion 306 into the wafer 310 can be avoided.

As the at least one opening arranged therebetween, the final energy filter 400 includes an exit-side einzel lens 308 and a slit 318. In order that a neutral beam or an ion beam colliding with the first deflection electrode 314 or the first downstream auxiliary electrode 410 cannot be seen from the wafer 310, the dimensions of the exit-side einzel lens 308 and the slit 318 and their placement positions are preferably determined such that the following inequality is satisfied.

$$(d+W_1/2)/L_2 > (W_1/2+W_2/2)/L_1$$

In the above inequality, $W_1$ indicates the opening width of the slit 318, and $W_2$ indicates the opening width of an entrance opening of the exit-side einzel lens 308. Also, $L_1$ indicates the distance, between the entrance opening of the exit-side einzel lens 308 and the slit 318, along the beam trajectory 302, and $L_2$ indicates the distance, between the neutral beam collision point 444 and the slit 318, along the beam trajectory 302. Also, d indicates the distance from the beam trajectory 302 to the neutral beam collision point 444. The neutral beam collision point 444 is a point at the intersection of a straight line, which is defined below, and the first deflection electrode 314. Here, the "straight line" is a line which passes through at least one of an opening upper edge 446 of an entrance electrode and an exit electrode of the entrance-side einzel lens 304 and which is parallel to the incident beam trajectory entering the deflection electrode portion 306. The opening upper edge 446 is an edge part of the opening, in the entrance-side einzel lens 304, located on a side of the above-described first electrode group (i.e., the first upstream auxiliary electrode 406, the first deflection electrode 314, and the first downstream auxiliary electrode 410 all of which are shown in FIG. 16).

With this configuration and arrangement as described above, the majority of the neutral beam or ion beam scattered by the first deflection electrode 314 can be blocked by the exit-side einzel lens 308 and the slit 318 so as to prevent the majority thereof from reaching the wafer 310.

In FIG. 21, $L_3$ indicates the distance between the entrance of the downstream auxiliary electrode portion 404 and the slit 318 along the beam trajectory 302, and g indicates the distance from the beam trajectory 302 to an upper edge of the entrance of the downstream auxiliary electrode portion 404. If the distance d and the distance g are equal to each other, it will suffice that the above-described inequality be taken into consideration. If, however, the distance d and the distance g differ from each other, it is desirable that the final energy filter 400 is so designed as to satisfy the following inequality, in addition or alternative to the above-described inequality.

$$(g+W_1/2)/L_3 > (W_1/2+W_2/2)/L_1$$

As described above, by employing the final energy filter 400 according to the present embodiment, the deviation or shift from the originally designed beam trajectory 302 can be suppressed to the minimum if the deflection electrode portion 306, where the energy of the ion beam is greatly changed before and after the deflection, is to be used. Also, optimizing the placement of electrodes and the shape thereof can reduce the energy contamination caused by the beam scattering on the electrodes.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
   an ion implantation processing chamber adapted to irradiate a workpiece with an ion beam having an intended energy;
   a beamline exit arranged upstream of the ion implantation processing chamber; and
   a final energy filter arranged between the beamline exit and the workpiece,
   the final energy filter comprising:
      a first adjustment electrode portion that adjusts a beam shape of the ion beam, the first adjustment electrode portion being arranged downstream of the beamline exit;
      an intermediate electrode portion that deflects the ion beam, the intermediate electrode portion being arranged downstream of the first adjustment electrode portion;
      a second adjustment electrode portion that adjusts the beam shape of the ion beam, the second adjustment electrode portion being arranged downstream of the intermediate electrode portion; and
      a power supply unit that applies voltages separately to the first adjustment electrode portion, the intermediate electrode portion and the second adjustment electrode portion, respectively, in a manner such that one of deceleration, acceleration and iso-energetic transportation of the ion beam is carried out between the first adjustment electrode portion and the intermediate electrode portion, and such that one of deceleration, acceleration and iso-energetic transportation of the ion beam is carried out between the intermediate electrode portion and the second adjustment electrode portion,
   wherein the intermediate electrode portion comprises:
      a deflection electrode portion;
      an upstream auxiliary electrode portion arranged between the first adjustment electrode portion and the deflection electrode portion; and
      a downstream auxiliary electrode portion arranged between the deflection electrode portion and the second adjustment electrode portion,
   wherein the power supply unit applies voltages to the upstream auxiliary electrode portion, the deflection electrode portion and the downstream auxiliary electrode portion, respectively, such that a first energy range of the ion beam in a first region between the upstream auxiliary electrode portion and the deflection electrode portion is approximately equal to a second energy range of the ion beam in a second region between the deflection electrode portion and the downstream auxiliary electrode portion.

2. The ion implantation apparatus according to claim 1, wherein the power supply unit applies voltages to the upstream auxiliary electrode portion, the deflection electrode portion and the downstream auxiliary electrode portion, respectively, such that the ion beam is transported iso-energetically in the intermediate electrode portion.

3. The ion implantation apparatus according to claim 2, wherein the deflection electrode portion comprises a first deflection electrode, which is arranged on one side of the ion beam, and a second deflection electrode which is disposed opposite to the first deflection electrode and which is arranged on the other side of the ion beam,
wherein:
the power supply unit applies an upstream auxiliary voltage to the upstream auxiliary electrode portion,
the power supply unit applies a downstream auxiliary voltage, which is equal to the upstream auxiliary voltage, to the downstream auxiliary electrode portion, and
the power supply unit applies voltages to the first deflection electrode and the second deflection electrode, respectively, such that an average voltage of the first deflection electrode and the second deflection electrode is equal to the upstream auxiliary voltage and the downstream auxiliary voltage.

4. The ion implantation apparatus according to claim 1, wherein the power supply unit applies voltages to the upstream auxiliary electrode portion, the deflection electrode portion and the downstream auxiliary electrode portion, respectively, such that the ion beam is accelerated between the upstream auxiliary electrode portion and the deflection electrode portion and is decelerated between the deflection electrode portion and the downstream auxiliary electrode portion, or such that the ion beam is decelerated between the upstream auxiliary electrode portion and the deflection electrode portion and is accelerated between the deflection electrode portion and the downstream auxiliary electrode portion.

5. The ion implantation apparatus according to claim 4, wherein the deflection electrode portion comprises a first deflection electrode, which is arranged on one side of the ion beam, and a second deflection electrode, which is disposed opposite to the first deflection electrode and which is arranged on the other side of the ion beam,
wherein:
the power supply unit applies an upstream auxiliary voltage to the upstream auxiliary electrode portion,
the power supply unit applies a downstream auxiliary voltage, which is equal to the upstream auxiliary voltage, to the downstream auxiliary electrode portion, and
the power supply unit applies voltages to the first deflection electrode and the second deflection electrode, respectively, such that an average voltage of the first deflection electrode and the second deflection electrode differs from the upstream auxiliary voltage and the downstream auxiliary voltage.

6. The ion implantation apparatus according to claim 1, wherein the intermediate electrode portion is formed to be symmetrical with respect to a plane of symmetry including a deflection point and vertical to a deflected beam trajectory in the deflection electrode portion, the deflection point being a point where an incident beam trajectory entering the deflection electrode portion intersects with an emission beam trajectory emitting from the deflection electrode portion.

7. The ion implantation apparatus according to claim 1, wherein at least one of the first adjustment electrode portion and the second adjustment electrode portion comprises an einzel lens or a suppression electrode.

8. The ion implantation apparatus according to claim 1, wherein the power supply unit applies voltages separately to the first adjustment electrode portion, the intermediate electrode portion and the second adjustment electrode portion, respectively, such that the ion beam is decelerated between the first adjustment electrode portion and the intermediate electrode portion, and/or such that the ion beam is decelerated between the intermediate electrode portion and the second adjustment electrode portion.

9. The ion implantation apparatus according to claim 1, wherein the final energy filter has at least one opening, formed between the downstream auxiliary electrode portion and the workpiece, such that at least part of a surface of the deflection electrode portion is invisible from the workpiece.

10. The ion implantation apparatus according to claim 9, wherein the at least one opening is a slit for restricting a beam size or an energy slit.

11. The ion implantation apparatus according to claim 9, wherein the at least one opening comprises a first opening and a second opening which are arranged along the beam trajectory, the second opening arranged upstream of the first opening,
wherein the final energy filter is configured such that $$(d+W_1/2)/L_2 > (W_1/2+W_2/2)/L_1$$

is satisfied, where $W_1$ indicates an opening width of the first opening, and $W_2$ indicates an opening width of the second opening, $L_1$ indicates a distance, between the first opening and the second opening, along the beam trajectory, $L_2$ indicates a distance, between the first opening and a neutral beam collision point located on the deflection electrode portion, along the beam trajectory, and d indicates a distance from the beam trajectory to the neutral beam collision point.

12. The ion implantation apparatus according to claim 11, wherein the neutral beam collision point is an intersection point of a straight line and the deflection electrode portion, the straight line being a line which passes through at least one of opening upper edges of an entrance electrode and an exit electrode of the first adjustment electrode portion and which is parallel to an incident beam trajectory entering the deflection electrode portion.

13. The ion implantation apparatus according to claim 11, wherein the first opening is a slit for restricting a beam size or an energy slit, and the second opening is an entrance electrode of the second adjustment electrode portion.

14. The ion implantation apparatus according to claim 9, wherein the at least one opening comprises a first opening and a second opening which are arranged along the beam trajectory, the second opening arranged upstream of the first opening,
wherein the final energy filter is configured such that $$(g+W_1/2)/L_3 > (W_1/2+W_2/2)/L_1$$

is satisfied, where $W_1$ indicates an opening width of the first opening, and $W_2$ indicates an opening width of the second opening, $L_1$ indicates a distance, between the first opening and the second opening, along the beam trajectory, $L_3$ indicates a distance, between the first opening and an entrance of the downstream auxiliary electrode portion, along the beam trajectory, and g indicates a distance from the beam trajectory to an edge of the entrance of the downstream auxiliary electrode portion.

15. The ion implantation apparatus according to claim 1, wherein the second adjustment electrode portion comprises at least one electrode portion, which is arranged in such a manner as to surround a beam trajectory or arranged on both sides of the beam trajectory in a vertical direction, and
wherein the at least one electrode portion comprises an inner surface facing the beam trajectory, and the inner surface comprises an edge portion having an inclined surface formed thereon such that the inclined surface is located away from the beam trajectory as the ion beam travels from an entrance of the electrode portion toward an exit thereof.

16. The ion implantation apparatus according to claim 15, wherein an inclination angle of the inclined surface is larger than a deflection angle at the deflection electrode portion.

17. The ion implantation apparatus according to claim 15, wherein the inner surface comprises a plurality of edge portions each having the inclined surface.

18. The ion implantation apparatus according to claim 1, wherein the power supply unit applies voltages separately to the first adjustment electrode portion, the intermediate electrode portion and the second adjustment electrode portion, respectively, such that the ion beam is iso-energetically transported between the first adjustment electrode portion and the second adjustment electrode portion.

19. The ion implantation apparatus according to claim 18, wherein the power supply unit applies voltages to the upstream auxiliary electrode portion, the deflection electrode portion and the downstream auxiliary electrode portion, respectively, such that the ion beam is deflected in at least one of the upstream auxiliary electrode portion and the downstream auxiliary electrode portion.

20. The ion implantation apparatus according to claim 1, further comprising a control unit for controlling the final energy filter,
wherein the control unit selects one of a plurality of operation modes according to the intended energy to operate the final energy filter, and
wherein the plurality of operation modes comprises a first operation mode in which the final energy filter is operated such that the ion beam is iso-energetically transported between the first adjustment electrode portion and the second adjustment electrode portion, and a second operation mode in which the final energy filter is operated such that the ion beam is decelerated between the first adjustment electrode portion and the intermediate electrode portion and such that the ion beam is decelerated between the intermediate electrode portion and the second adjustment electrode portion.

21. The ion implantation apparatus according to claim 20, wherein:
when the intended energy is greater than a predetermined threshold value, the control unit selects the first operation mode, and
when the intended energy is less than the predetermined threshold value, the control unit selects the second operation mode.

22. A final energy filter arranged between an ion implantation processing chamber adapted to irradiate a workpiece with an ion beam having an intended energy, and a beamline exit arranged upstream of the ion implantation processing chamber, the final energy filter comprising:
a first adjustment electrode portion that adjusts a beam shape of the ion beam, the first adjustment electrode portion being arranged downstream of the beamline exit;
an intermediate electrode portion that deflects the ion beam, the intermediate electrode portion being arranged downstream of the first adjustment electrode portion;
a second adjustment electrode portion that adjusts the beam shape of the ion beam, the second adjustment electrode portion being arranged downstream of the intermediate electrode portion; and
a power supply unit that applies voltages separately to the first adjustment electrode portion, the intermediate electrode portion and the second adjustment electrode portion, respectively, in a manner such that one of deceleration, acceleration and iso-energetic transportation of the ion beam is carried out between the first adjustment electrode portion and the intermediate electrode portion, and such that one of deceleration, acceleration and iso-energetic transportation of the ion beam is carried out between the intermediate electrode portion and the second adjustment electrode portion,
wherein the intermediate electrode portion comprises:
a deflection electrode portion;
an upstream auxiliary electrode portion arranged between the first adjustment electrode portion and the deflection electrode portion; and
a downstream auxiliary electrode arranged between the deflection electrode portion and the second adjustment electrode portion,
wherein the power supply unit applies voltages to the upstream auxiliary electrode portion, the deflection electrode portion and the downstream auxiliary electrode portion, respectively, such that a first energy range of the ion beam in a first region between the upstream auxiliary electrode portion and the deflection electrode portion is approximately equal to a second energy range of the ion beam in a second region between the deflection electrode portion and the downstream auxiliary electrode portion.

23. A method for implanting ions to a workpiece, comprising:
directing an ion beam, having an intended energy, to the workpiece through a final energy filter; and
irradiating the workpiece with the ion beam having the intended energy,
the final energy filter being arranged between an implantation processing chamber adapted to irradiating the workpiece with the ion bean and a beamline exit arranged upstream of the ion implantation processing chamber,
the final energy filter comprising:
a first adjustment electrode portion that adjusts a beam shape of the ion beam, the first adjustment electrode portion being arranged downstream of the beamline exit;
an intermediate electrode portion that deflects the ion beam, the intermediate electrode portion being arranged downstream of the first adjustment electrode portion;
a second adjustment electrode portion that adjusts the beam shape of the ion beam, the second adjustment electrode portion being arranged downstream of the intermediate electrode portion; and
a power supply unit that applies voltages separately to the first adjustment electrode portion, the intermediate electrode portion and the second adjustment electrode portion, respectively, in a manner such that one of deceleration, acceleration and iso-energetic transportation of the ion beam is carried out between the first adjustment electrode portion and the intermediate electrode portion, and such that one of deceleration, acceleration and isoenergetic transportation of the ion beam is carried out between the intermediate electrode portion and the second adjustment electrode portion,
wherein the intermediate electrode portion comprises:
  a deflection electrode portion;
  an upstream auxiliary electrode portion arranged between the first adjustment electrode portion and the deflection electrode portion; and
  a downstream auxiliary electrode portion arranged between the deflection electrode portion and the second adjustment electrode portion,
wherein the power supply unit applies voltages to the upstream auxiliary electrode portion, the deflection electrode portion and the downstream auxiliary electrode portion, respectively, such that a first energy range of the ion beam in a first region between the upstream auxiliary electrode portion and the deflection electrode portion is approximately equal to a second energy range of the ion beam in a second region between the deflection electrode portion and the downstream auxiliary electrode portion.

* * * * *